US012794464B2

(12) United States Patent
Basha et al.

(10) Patent No.: US 12,794,464 B2
(45) Date of Patent: Nov. 10, 2026

(54) DRIVER CIRCUIT WITH OVERCURRENT PROTECTION

(71) Applicant: TEXAS INSTRUMENTS INCORPORATED, Dallas, TX (US)

(72) Inventors: Shaik Basha, Bengaluru (IN); Rejin Kanjavalappil Raveendranath, Bengaluru (IN); Asish Das, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

(21) Appl. No.: 18/241,025

(22) Filed: Aug. 31, 2023

(65) Prior Publication Data

US 2024/0297643 A1 Sep. 5, 2024

(30) Foreign Application Priority Data

Mar. 2, 2023 (IN) ............................. 202341013966

(51) Int. Cl.
*H03K 17/08* (2006.01)
*H03K 19/21* (2006.01)
*H04R 3/00* (2006.01)

(52) U.S. Cl.
CPC ............. *H03K 17/08* (2013.01); *H03K 19/21* (2013.01); *H04R 3/007* (2013.01)

(58) Field of Classification Search
CPC ......... H03K 17/08; H03K 19/21; H04R 3/007
See application file for complete search history.

(56) References Cited

U.S. PATENT DOCUMENTS 8,553,378 B2 * 10/2013 Saito ................... H02M 3/1588 361/18
9,954,461 B1 * 4/2018 Duvnjak ............ H03K 17/0822
10,483,873 B2 * 11/2019 Tanabe .............. H02M 7/53871
10,855,269 B2 * 12/2020 Mochiki ................. H02M 1/08
11,437,911 B2 * 9/2022 Duvnjak ............... H02M 3/156
12,068,676 B2 * 8/2024 Nakamori ......... H02M 7/53871
2013/0094114 A1 * 4/2013 Shimizu ............... H03K 17/567 361/87
2014/0111171 A1 * 4/2014 Kosugi ................... H02M 1/36 323/271
2015/0236686 A1 * 8/2015 Senda .................... H03K 17/60 327/381
2016/0352319 A1 * 12/2016 Nagase ................... H02M 1/08
2022/0302822 A1 * 9/2022 Fukushima ............. H02M 1/32

* cited by examiner

*Primary Examiner* — Crystal L Hammond
*Assistant Examiner* — Samantha L Faubert
(74) *Attorney, Agent, or Firm* — Xianghui Huang; Chuck F. Koch

(57) ABSTRACT

A circuit includes a driver circuit. The driver circuit includes a power stage and an overcurrent control circuit. The power stage includes an output switch. The overcurrent control circuit includes a switch control circuitry and overcurrent detection circuitry. The switch control circuitry is configured to: receive a first control signal; and provide a second control signal to a control terminal of the output switch responsive to a delay interval relative to the first control signal and overcurrent detection results obtained by the overcurrent detection circuitry during the delay interval.

20 Claims, 9 Drawing Sheets

DRIVER CIRCUIT WITH OVERCURRENT PROTECTION

CROSS REFERENCE TO RELATED APPLICATION

The present application is related to: India Provisional Application No. 202341013966, titled “Cycle to Cycle Over Current Detection in H-Bridge”, filed on Mar. 2, 2023, which is hereby incorporated by reference in its entirety.

BACKGROUND

Many driver circuits include switch-based power stages and related controllers to control the state of each switch based on an input voltage, a target output voltage, a load, and/or other regulation parameters. During driver circuit operation, an overcurrent condition may occur due to a short circuit between the output terminal of a driver circuit and ground or a short circuit between output terminals of the driver circuit. The overcurrent condition may result in damage to or a shortened life of one or more switches of the power stage.

SUMMARY

In an example, a circuit includes a driver circuit having a first terminal, a second terminal, and a third terminal. The driver circuit includes a power stage having a first terminal, a second terminal, and a third terminal. The first terminal of the power stage is coupled to the first terminal of the driver circuit. The third terminal of the power stage is coupled to the third terminal of the driver circuit. The power stage includes an output switch having a first terminal, a second terminal, and a control terminal. The first terminal of the output switch is coupled to the first terminal of the power stage. The second terminal of the output switch is coupled to the third terminal of the power stage. The control terminal of the output switch is coupled to the second terminal of the power stage. The circuit also includes an overcurrent control circuit having a first terminal, a second terminal, and a third terminal. The first terminal of the overcurrent control circuit is coupled to the second terminal of the power stage. The second terminal of the overcurrent control circuit coupled to the third terminal of the power stage. The third terminal of the overcurrent control circuit coupled to the second terminal of the driver circuit. The overcurrent control circuit includes switch control circuitry and overcurrent detection circuitry. The switch control circuitry is configured to: receive a first control signal; and provide a second control signal to the control terminal of the output switch responsive to a delay interval relative to the first control signal and overcurrent detection results obtained by the overcurrent detection circuitry during the delay interval.

In another example, a circuit includes a driver circuit having a first terminal, a second terminal, and a third terminal. The driver circuit includes an output switch. The driver circuit is configured to: receive a supply voltage at its first terminal; receive a pulse-width modulation (PWM) control signal at its second terminal; and control the output switch to provide an output voltage at its third terminal responsive to the supply voltage, the PWM control signal, and overcurrent detection results.

In yet another example, a driver circuit method includes: receiving a control signal; providing a first switch control signal responsive to the control signal; obtaining overcurrent detection results; and after a delay interval, providing a second switch control signal responsive to the overcurrent detection results indicating there is no overcurrent condition.

DETAILED DESCRIPTION

Figure 1:
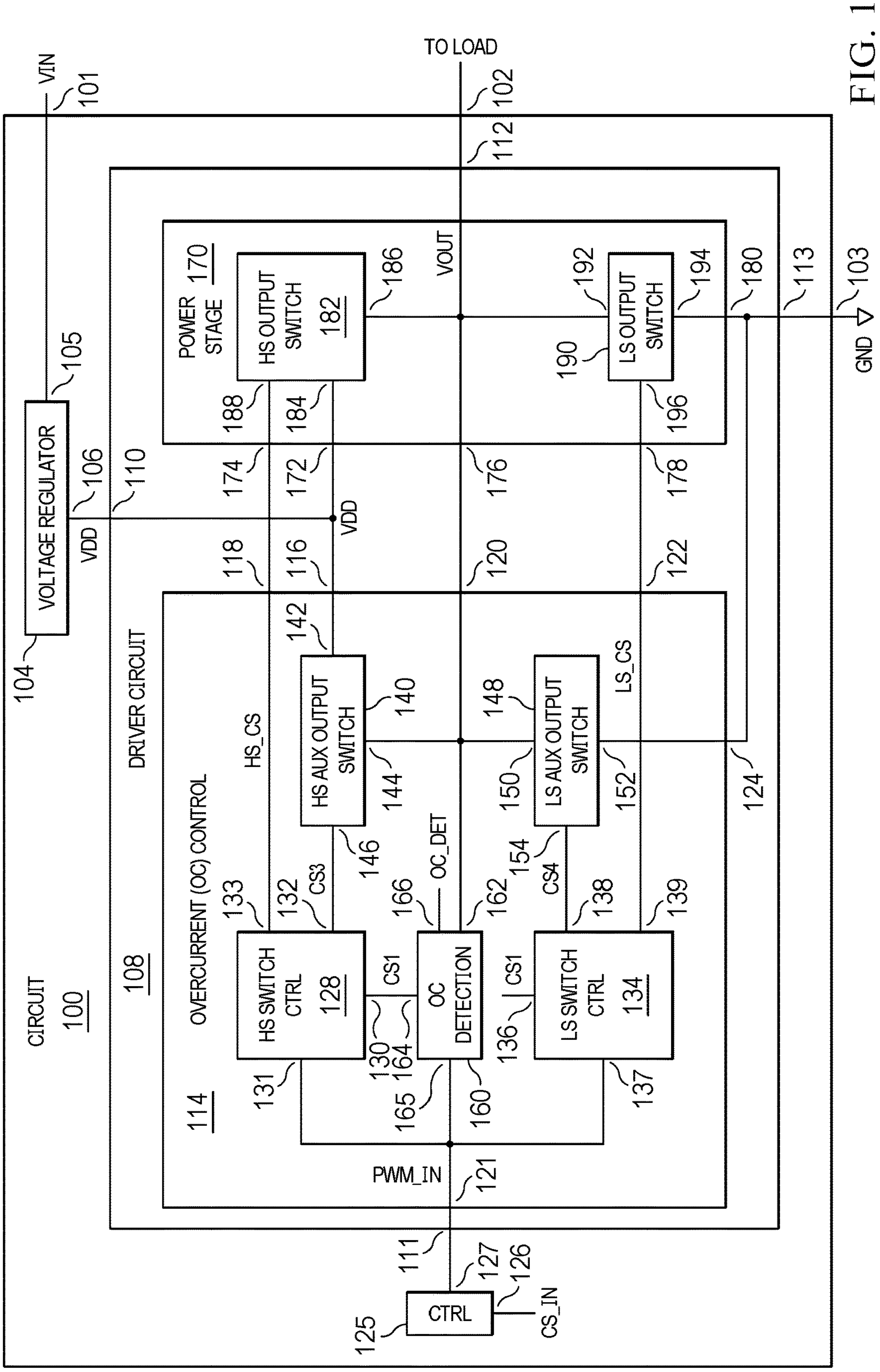
FIG. 1 is a diagram showing an example circuit having a driver circuit with overcurrent control.

The same reference numbers or other reference designators are used in the drawings to designate the same or similar features. Such features may be the same or similar either by function and/or structure.

FIG. 1 is a diagram showing an example circuit 100 having a driver circuit 108 with overcurrent control. In the example of FIG. 1, the circuit 100 in an integrated circuit (IC). In other examples, the circuit 100 may include multiple ICs. As shown, the circuit 100 has a first terminal 101, a second terminal 102, and a third terminal 103. The circuit 100 includes a voltage regulator 104, the driver circuit 108, and a controller 125. The voltage regulator 104 has a first terminal 105 and a second terminal 106. The driver circuit 108 has a first terminal 110, a second terminal 111, a third terminal 112, and a fourth terminal 113. The controller 125 has first terminal(s) 126 and a second terminal 127.

In the example of FIG. 1, the driver circuit 108 includes an overcurrent (OC) control circuit 114 and a power stage 170. The OC control circuit 114 has first terminal 116, a second terminal 118, a third terminal 120, a fourth terminal 121, a fifth terminal 122, and a sixth terminal 124. The power stage 170 has a first terminal 172, a second terminal 174, a third terminal 176, a fourth terminal 178, and a fifth terminal 180.

As shown, the OC control circuit 114 includes high-side (HS) switch control circuitry 128, low-side (LS) switch control circuitry 134, OC detection circuitry 160, a HS auxiliary output switch 140, and a LS auxiliary output switch 148. The HS switch control circuitry 128 has a first terminal 130, a second terminal 131, a third terminal 132, and a fourth terminal 133. The LS switch control circuitry 134 has a first terminal 136, a second terminal 137, a third terminal 138, and a fourth terminal 139. The OC detection circuitry 160 has a first terminal 162, a second terminal 164, a third terminal, 165, and a fourth terminal 166. The HS auxiliary output switch 140 has a first terminal 142, a second terminal 144, and a control terminal 146. The LS auxiliary output switch 148 has a first terminal 150, a second terminal 152, and a control terminal 154. The power stage 170 includes an HS output switch 182 and a LS output switch 190. The HS output switch 182 has a first terminal 184, a second terminal 186, and a control terminal 188. The LS output switch 190 has a first terminal 192, a second terminal 194, and a control terminal 196.

In the example of FIG. 1, the first terminal 101 of the circuit 100 is coupled to the first terminal 105 of the voltage regulator 104 and provides an input voltage (VIN). The second terminal 106 of the voltage regulator 104 is coupled to the first terminal 110 of the driver circuit 108. The first terminal(s) 126 of the controller 125 receive control parameters (CS_IN). In different examples, CS_IN may include a current sense signal, a triangular wave, and/or other control parameters.

The second terminal 127 of the controller 125 is coupled to the second terminal 111 of the driver circuit 108 and provide a control signal such as a pulse-width modulation control signal (PWM_IN). The second terminal 102 of the circuit 100 is coupled to the third terminal 112 of the driver circuit 108. The third terminal 103 of the circuit 100, the fourth terminal 113 of the driver circuit 108, the sixth terminal 124 of the OC control circuit 114, and the fifth terminal 180 of the power stage 170 are coupled to ground terminals or ground.

The first terminal 116 of the OC control circuit 114 is coupled to the first terminal 110 of the driver circuit 108 and the first terminal of the power stage 170. The second terminal 118 of the OC control circuit 114 is coupled to the second terminal 174 of the power stage 170. The third terminal 120 of the OC control circuit 114 is coupled to the third terminal 176 of the power stage 170. The fourth terminal 121 of the OC control circuit 114 is coupled to the second terminal 111 in the driver circuit 108. The fifth terminal 122 of the OC control circuit 114 is coupled to the fourth terminal 178 of the power stage 170. The sixth terminal 124 of the OC control circuit 114 is coupled to the fourth terminal 113 of the driver circuit 108. The fifth terminal 180 of the power stage 170 is also coupled to the fourth terminal 113 of the driver circuit 108.

The first terminal 130 of the HS switch control circuitry 128 is coupled to the second terminal 164 of the OC detection circuitry 160. The second terminal 131 of the HS switch control circuitry 128 is coupled to the fourth terminal 121 of the OC control circuit 114. The third terminal 132 of the HS switch control circuitry 128 is coupled to the control terminal 146 of the HS auxiliary output switch 140. The fourth terminal 133 of the HS switch control circuitry 128 is coupled to the second terminal 118 of the OC control circuit 114. The first terminal 142 of the HS auxiliary output switch 140 is coupled to the first terminal 116 of the OC control circuit 114. The second terminal 144 of the HS auxiliary output switch 140 is coupled to the third terminal 120 of the OC control circuit 114.

The first terminal 136 of the LS switch control circuitry 134 is coupled to the second terminal 164 of the OC detection circuitry 160. The second terminal 137 of the LS switch control circuitry 134 is coupled to the fourth terminal 121 of the OC control circuit 114. The third terminal 138 of the LS switch control circuitry 134 is coupled to the control terminal 154 of the LS auxiliary output switch 148. The fourth terminal 139 of the LS switch control circuitry 134 is coupled to the fifth terminal 122 of the OC control circuit 114. The first terminal 150 of the LS auxiliary output switch 148 is coupled to the third terminal 120 of the OC control circuit 114. The second terminal 152 of the LS auxiliary output switch 148 is coupled to the sixth terminal 124 of the OC control circuit 114.

The first terminal 162 of the OC detection circuitry 160 is coupled to the third terminal 120 of the OC control circuit 114. As noted previously, the second terminal 164 of the OC detection circuitry 160 is coupled to the first terminal 130 of the HS switch control circuitry 128 and to the first terminal 136 of the LS switch control circuitry 134. The third terminal 165 of the OC detection circuitry 160 is coupled to the fourth terminal 121 of the OC control circuit 114. The fourth terminal 166 of the OC detection circuitry 160 provides an overcurrent detection signal (OC_DET).

The first terminal 184 of the HS output switch 182 is coupled to the first terminal 172 of the power stage 170. The second terminal 186 of the HS output switch 182 is coupled to the third terminal 176 of the power stage 170. The control terminal 188 of the HS output switch 182 is coupled to the second terminal 174 of the power stage 170. The first terminal 192 of the LS output switch 190 is coupled to the third terminal 176 of the power stage 170. The second terminal 194 of the LS output switch 190 is coupled to the fifth terminal 180 of the power stage 170. The control terminal 196 of the LS output switch 190 is coupled to the fourth terminal 178 of the power stage 170.

In some examples, the circuit 100 operates to: receive VIN at its first terminal 101; and provide VOUT at its second terminal 102 responsive to the operations of the voltage regulator 104, the driver circuit 108, and the controller 125. The voltage regulator 104 operates to: receive VIN at its first terminal 105; and provide a supply voltage (VDD) at its second terminal 106 responsive to VIN, a target supply voltage, and/or other regulation parameters. The controller 125 operates to: receive CS_IN at its first terminal(s) 126; and provide PWM_IN at its second terminal 127 responsive to CS_IN.

The driver circuit 108 operates to: receive VDD at its first terminal 110; receive PWM_IN at its second terminal 111; and control an output switch (e.g., the HS output switch 182 or the LS output switch 190) and an auxiliary output switch (e.g., the HS auxiliary output switch 140 or the LS auxiliary output switch 148) to provide VOUT at its third terminal 112 responsive to the VDD, PWM_IN, and overcurrent detection results indicated by OC_DET.

The OC control circuit 114 operates to: receive VDD at its first terminal 116; receive PWM_IN at its fourth terminal 121; turn on an auxiliary output switch (e.g., the HS auxiliary output switch 140 or the LS auxiliary output switch 148) to provide VOUT at its third terminal 120 responsive to the VDD and PWM_IN; provide OC_DET responsive to VOUT and a reference voltage (VREF); and, after a delay interval, provide a control signal (e.g., HS_CS or LS_CS) for an output switch (e.g., the HS output switch 182 or the LS output switch 190) responsive to PWM_IN and OC_DET indicating there is no overcurrent condition. If OC_DET indicates there is an overcurrent condition, the driver circuit 108 shuts down or otherwise stops normal operations due to the overcurrent condition.

The OC detection circuitry 160 operates to: receive VOUT at its first terminal 162; compare VOUT to VREF to obtain comparison results; provide a first control signal (CS1) at its second terminal 164 responsive to the comparison results; receive PWM_IN at its third terminal 165; and provide OC_DET at its fourth terminal 166 responsive to PWM_IN and the comparison results.

The HS switch control circuitry 128 operates to: receive CS1 at its first terminal 130; receive PWM_IN at its second terminal 131; provide a control signal (CS3) at its third terminal 132 responsive to PWM_IN; and, after a delay interval, provide HS_CS at its fourth terminal 133 responsive to PWM_IN and CS1. The LS switch control circuitry 134 operates to: receive CS1 at its first terminal 136; receive PWM_IN at its second terminal 137; provide a control signal (CS4) at its third terminal 138 responsive to PWM_IN; and, after a delay interval, provide LS_CS at its fourth terminal 139 responsive to PWM_IN and CS1.

In the example of FIG. 1, the HS auxiliary output switch 140 turns on and off responsive to CS3. When the HS auxiliary output switch 140 is on, current flows from the first terminal 116 of the OC control circuit 114 to the third terminal 120 of the OC control circuit 114 and VOUT increases. The LS auxiliary output switch 148 turns on and off responsive to CS4. When the LS auxiliary output switch 148 is on, current flows from the third terminal 120 of the OC control circuit 114 to the sixth terminal 124 of the OC control circuit 114 and VOUT decreases.

The power stage 170 operates to: receive VDD at its first terminal 172; receive HS_CS at its second terminal 174; receive LS_CS at its fourth terminal 178; and adjust VOUT at its third terminal 176 responsive to the VDD, HS_CS, and LS_CS. The HS output switch 182 turns on and off responsive to CS_HS. When the HS output switch 182 is on, current flows from the first terminal 172 of the power stage 170 to the third terminal 176 of the power stage 170 and VOUT increases. The LS output switch 190 turns on and off responsive to LS_CS. When the LS output switch 190 is on, current flows from the third terminal 176 of the power stage to fifth terminal 180 of the power stage 170 and VOUT decreases.

In different examples, the topology of the power stage 170 may vary. In the example of FIG. 1, a half-bridge topology with two output switches is represented. In other examples, the power stage 170 may have a full-bridge topology with four output switches. In other examples, the power stage 170 may have a multi-bridge topology to support different loads efficiently. For different topologies of the power stage 170, CS_IN and the number of control signals provided by the controller 125 may vary. Regardless of the number of output switches in the power stage 170, the OC control circuit 114 may include a respective auxiliary output switch in parallel with each output switch. For example, an auxiliary output switch may be in parallel with a respective high-side output switch between the first terminal 110 of the driver circuit 108 and the third terminal 112 of the driver circuit 108. As another example, an auxiliary output switch may be in parallel with a respective low-side output switch between the third terminal 112 of the driver circuit 108 and the fourth terminal 113 of the driver circuit 108. With this arrangement, each auxiliary output switch is turned on before a respective output switch responsive to a control signal (e.g., PWM_IN or similar control signals) and overcurrent detection results are obtained. After a delay interval, each output switch is turned on responsive to a control signal (e.g., PWM_IN or similar control signals) and the overcurrent detection results (e.g., the VOUT to VREF comparison results and/or OC_DET) indicating there is no overcurrent condition.

In other examples, auxiliary output switches, such as the HS auxiliary output switch 140 and the LS auxiliary output switch 148, are omitted. Instead of auxiliary output switches, the OC control circuit 114 may provide different gate control voltages to adjust the extent to which output switches, such as the HS output switch 182 and the LS output switch 190, are turned on responsive to PWM_IN and overcurrent detection results. For example, an output switch may be turned on partially responsive to PWM_IN while overcurrent detection results are obtained. If the overcurrent detection results indicate there is no overcurrent condition, the output switch is turned on more fully. If the overcurrent detection results indicate there is an overcurrent condition, the output switch is turned off. Other driver circuit components and possibly the entire driver circuit may be turned off responsive to an overcurrent condition being detected.

Figure 2:
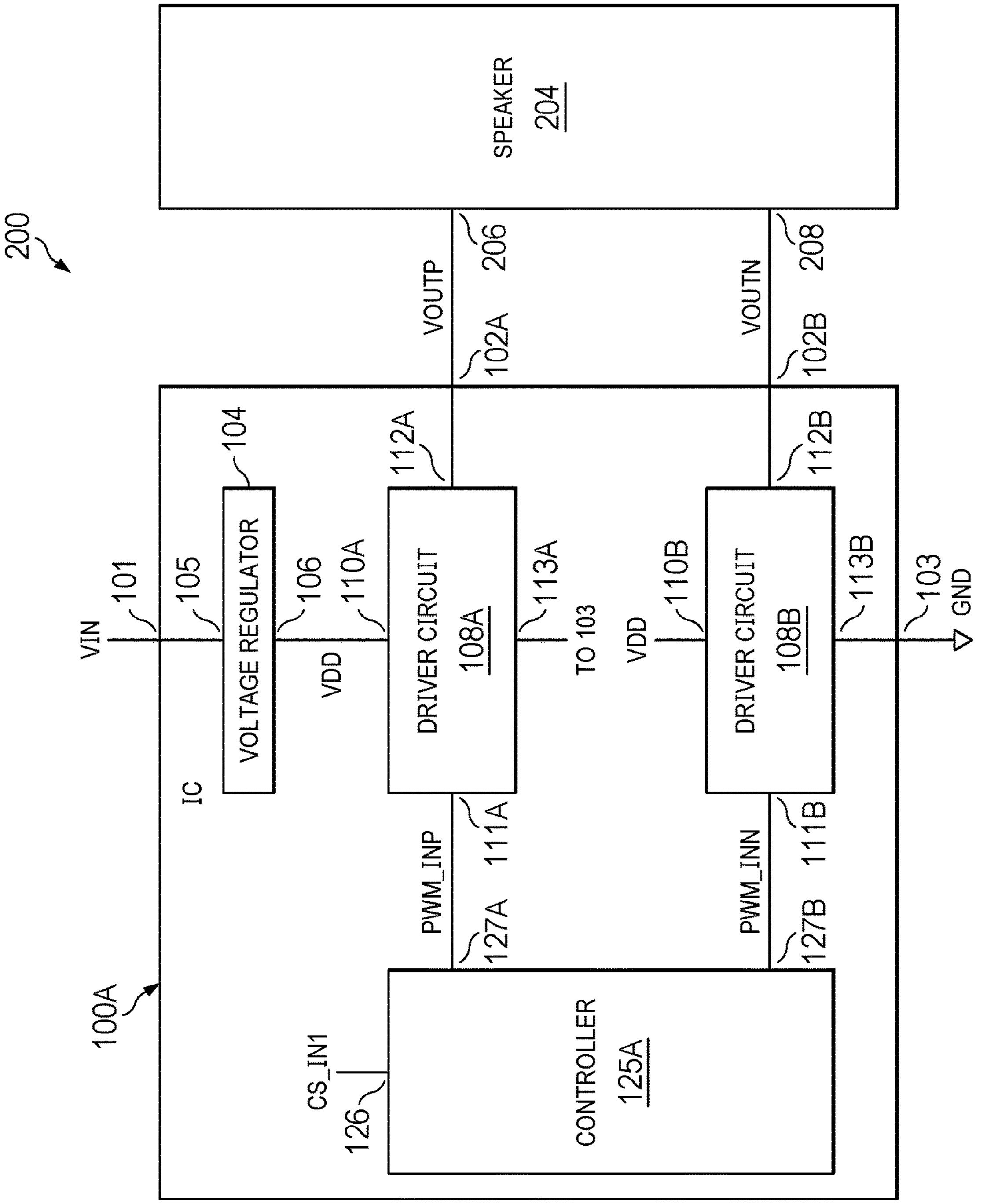
FIGS. 2 to 4 are diagrams showing example systems having driver circuits with overcurrent control.

FIG. 2 is a diagram showing an example system 200 having driver circuits 108A and 108B with overcurrent control. In the example of FIG. 2, the driver circuits 108A and 108B are examples of the driver circuit 108 in FIG. 1. As shown, the system 200 includes an IC 100A coupled to a speaker 204. The IC 100A is an example of the circuit 100 in FIG. 1 and has the first terminal 101, second terminals 102A and 102B, and the third terminal 103. The second terminals 102A and 102B are examples of the second terminal 102 in FIG. 1. The speaker 204 has a first terminal 206 and a second terminal 208.

As shown, the IC 100A includes the voltage regulator 104, a controller 125A, the driver circuit 108A, and the driver circuit 108B. The controller 125A is an example of the controller 125 in FIG. 1. The voltage regulator 104 has the first terminal 105 and the second terminal 106 described in FIG. 1. The controller 125A has the first terminal(s) 126 and second terminals 127A and 127B. The second terminals 127A and 127B are examples of the second terminal 127 of FIG. 1. The driver circuit 108A has a first terminal 110A, a second terminal 111A, a third terminal 112A, and a fourth terminal 113A. The first terminal 110A, the second terminal 111A, the third terminal 112A, and the fourth terminal 113A are examples of the first terminal 110, the second terminal 111, the third terminal 112, and the fourth terminal 113 in FIG. 1. The driver circuit 108B has a first terminal 110B, a second terminal 111B, a third terminal 112B, and a fourth terminal 113B. The first terminal 110B, the second terminal 111B, the third terminal 112B, and the fourth terminal 113B are examples of the first terminal 110, the second terminal 111, the third terminal 112, and the fourth terminal 113 in FIG. 1.

In the example of FIG. 2, the first terminal 101 of the IC 100A is coupled to the first terminal 105 of the voltage regulator 104. The second terminal 102A of the IC 100A is coupled to the first terminal 206 of the speaker 204. The second terminal 102B of the IC 100A is coupled to the second terminal 208 of the speaker 204. The third terminal 103 of the IC 100A is coupled to a ground terminal or ground.

The second terminal 106 of the voltage regulator 104 is coupled to the first terminal 110A of the driver circuit 108A and to the first terminal 110B of the driver circuit 108B. The second terminal 111A of the driver circuit 108A is coupled to the second terminal 127A of the controller 125A. The third terminal 112A of the driver circuit 108A is coupled to the second terminal 102A of the IC 100A. The fourth terminal 113A of the driver circuit 108A is coupled to the third terminal 103 of the IC 100A. The second terminal 111B of the driver circuit 108B is coupled to the second terminal 127B of the controller 125A. The third terminal 112B of the driver circuit 108B is coupled to the second terminal 102B of the IC 100A. The fourth terminal 113B of the driver circuit 108B is coupled to the third terminal 103 of the IC 100A.

In the example of FIG. 2, the first terminal 101 of the IC 100A is coupled to the first terminal 105A of the first voltage regulator 104A and provides VIN. The second terminal 106 of the voltage regulator 104 is coupled to the first terminal 110A of the driver circuit 108A and to the first terminal 110B of the driver circuit 108B. The first terminal(s) 126 of the controller 125A receive control parameters (CS_IN1). In different examples, CS_IN1 may include a current sense signal, a triangular wave, and/or other control parameters. The second terminal 127A of the controller 125A is coupled to the second terminal 111A of the driver circuit 108A and provides a control signal such as a pulse-width modulation control signal (PWM_INP). The second terminal 127B of the controller 125A is coupled to the second terminal 111B of the driver circuit 108B and provides a control signal such as a pulse-width modulation control signal (PWM_INN). The second terminal 102A of the IC 100A is coupled to the third terminal 112A of the driver circuit 108A. The second terminal 102B of the IC 100A is coupled to the third terminal 112B of the driver circuit 108B. The third terminal 103 of the IC 100A, the fourth terminal 113A of the driver circuit 108A, and the fourth terminal 113B of the driver circuit 108B are coupled to ground terminals or ground.

In the example of FIG. 2, the voltage regulator 104 operates to: receive VIN at its first terminal 105; and provide VDD at its second terminal 106 responsive to VIN and regulation parameters. The controller 125A operates to: receive CS_IN1 at its first terminal(s) 126; provide PWM_INP at its second terminal 127A responsive to CS_IN1; and provide PWM_INN at its second terminal 127B responsive to CS_IN1.

The driver circuit 108A operates to: receive VDD at its first terminal 110A; receive PWM_INP at its second terminal 111A; and provide a first output voltage (VOUTP) at its third terminal 112A responsive to VDD and PWM_INP. The driver circuit 108B operates to: receive VDD at its first terminal 110B; receive PWM_INN at its second terminal 111B; and provide a second output voltage (VOUTN) at its third terminal 112B responsive to VDD and PWM_INN. Together, the driver circuit 108A and the driver circuit 108B of the IC 100A form a full H-bridge topology to provide a differential voltage to drive the speaker 204. In some examples, each of the driver circuits 108A and 108B includes an overcurrent control circuit such as the OC control circuit 114 of FIG. 1 to account for an overcurrent condition as described herein.

Figure 3:
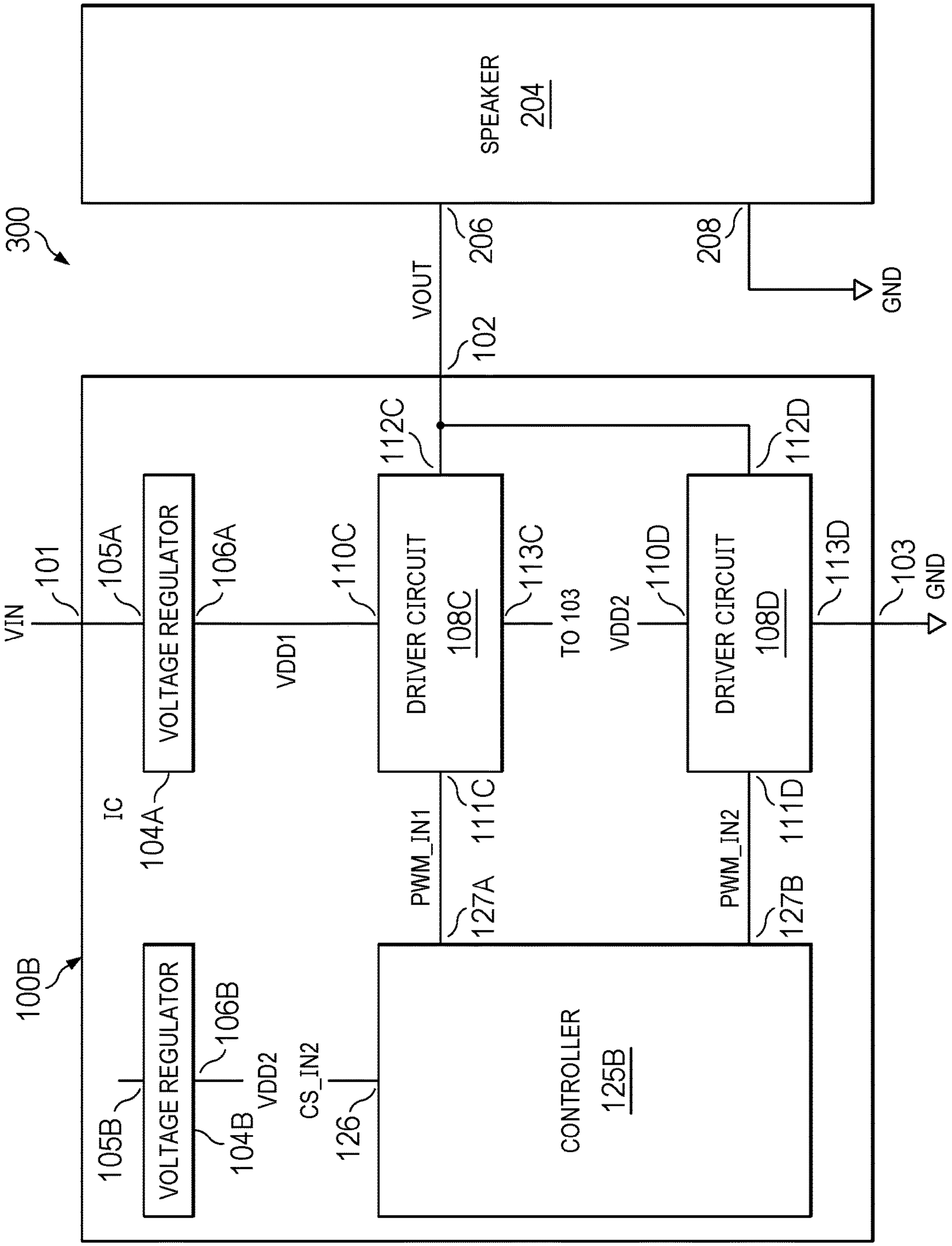

FIG. 3 is a diagram showing another example system 300 having driver circuits 108C and 108D with overcurrent control. In the example of FIG. 3, the driver circuits 108C and 108D are examples of the driver circuit 108 in FIG. 1. As shown, the system 300 includes an IC 100B coupled to the speaker 204. The IC 100B is an example of the circuit 100 in FIG. 1 and has the first terminal 101, the second terminal 102, and the third terminal 103.

As shown, the IC 100B includes a first voltage regulator 104A, a second voltage regulator 124B, a controller 125B, the driver circuit 108C, and the driver circuit 108D. The controller 125A is an example of the controller 125 in FIG. 1. The first voltage regulator 104A has a first terminal 105A and a second terminal 106A. The first terminal 105A and the second terminal 106A of the first voltage regulator 104A are examples of the first terminal 105 and the second terminal 106 described in FIG. 1. The second voltage regulator 104B has a first terminal 105B and a second terminal 106B. The first terminal 105B and the second terminal 106B of the second voltage regulator 104B are examples of the first terminal 105 and the second terminal 106 described in FIG. 1. The controller 125B has the first terminal(s) 126 and second terminals 127A and 127B. The second terminals 127A and 127B are examples of the second terminal 127 of FIG. 1. The driver circuit 108C has a first terminal 110C, a second terminal 111C, a third terminal 112C, and a fourth terminal 113C. The first terminal 110C, the second terminal 111C, the third terminal 112C, and the fourth terminal 113C are examples of the first terminal 110, the second terminal 111, the third terminal 112, and the fourth terminal 113 in FIG. 1. The driver circuit 108D has a first terminal 110D, a second terminal 111D, a third terminal 112D, and a fourth terminal 113D. The first terminal 110D, the second terminal 111D, the third terminal 112D, and the fourth terminal 113D are examples of the first terminal 110, the second terminal 111, the third terminal 112, and the fourth terminal 113 in FIG. 1.

In the example of FIG. 3, the first terminal 101 of the IC 100B is coupled to the first terminal 105A of the first voltage regulator 104A and to the first terminal 105B of the second voltage regulator 104B. The second terminal 106A of the first voltage regulator 104A is coupled to the first terminal 110C of the driver circuit 108C and to the first terminal 110D of the driver circuit 108D. The first terminal(s) 126 of the controller 125B receive control parameters (CS_IN2). In different examples, CS_IN2 may include a current sense signal, a triangular wave, and/or other control parameters. The second terminal 127A of the controller 125B is coupled to the second terminal 111C of the driver circuit 108C and provides a control signal such as a pulse-width modulation control signal (PWM_IN1). The second terminal 127B of the controller 125B is coupled to the second terminal 111D of the driver circuit 108D and provides a control signal such as a pulse-width modulation control signal (PWM_IN2). The second terminal 102 of the IC 100A is coupled to the third terminal 112C of the driver circuit 108C and to the third terminal 112D of the driver circuit 108D. The third terminal 103 of the IC 100B, the fourth terminal 113C of the driver circuit 108C, and the fourth terminal 113D of the driver circuit 108D are coupled to ground terminals or ground.

In the example of FIG. 3, the first voltage regulator 104A operates to: receive VIN at its first terminal 105A; and provide a first supply voltage (VDD1) at its second terminal 106A responsive to VIN and regulation parameters. The second voltage regulator 104B operates to: receive VIN at its first terminal 105B; and provide a second supply voltage (VDD2) at its second terminal 106B responsive to VIN and regulation parameters. In some examples, VDD2 is higher than VDD1. The controller 125A operates to: receive CS_IN2 at its first terminal(s) 126; provide PWM_IN1 at its second terminal 127A responsive to CS_IN2; and provide PWM_IN2 at its second terminal 127B responsive to CS_IN2.

The driver circuit 108C operates to: receive VDD1 at its first terminal 110C; receive PWM_IN1 at its second terminal 111C; and provide VOUT at its third terminal 112A responsive to VDD and PWM_INP. The driver circuit 108D operates to: receive VDD2 at its first terminal 110D; receive PWM_IN2 at its second terminal 111D; and provide VOUT at its third terminal 112D responsive to VDD2 and PWM_IN2. Together, the driver circuit 108C and the driver circuit 108D of the IC 100B form a multi-bridge topology to provide VOUT to drive the speaker 204. The multi-bridge topology enable VOUT to be provided using the driver circuit 108C, the driver circuit 108D, or both depending on a target load. In some examples, each of the driver circuits 108C and 108D includes an overcurrent control circuit such as the OC control circuit 114 of FIG. 1 to account for an overcurrent condition as described herein.

In the example of FIG. 3, the first terminal 206 of the speaker 204 is coupled to the second terminal 102 of the IC 100B and receives VOUT, while the second terminal 208 of the speaker 204 is coupled to a ground terminal or ground. In other examples, the second terminal 208 of the speaker 204 may be coupled to another output terminal of an IC. In different examples, the other output terminal may provide a second output voltage to the second terminal 208 of the speaker based on a half-bridge topology or a multi-bridge topology.

Figure 4:
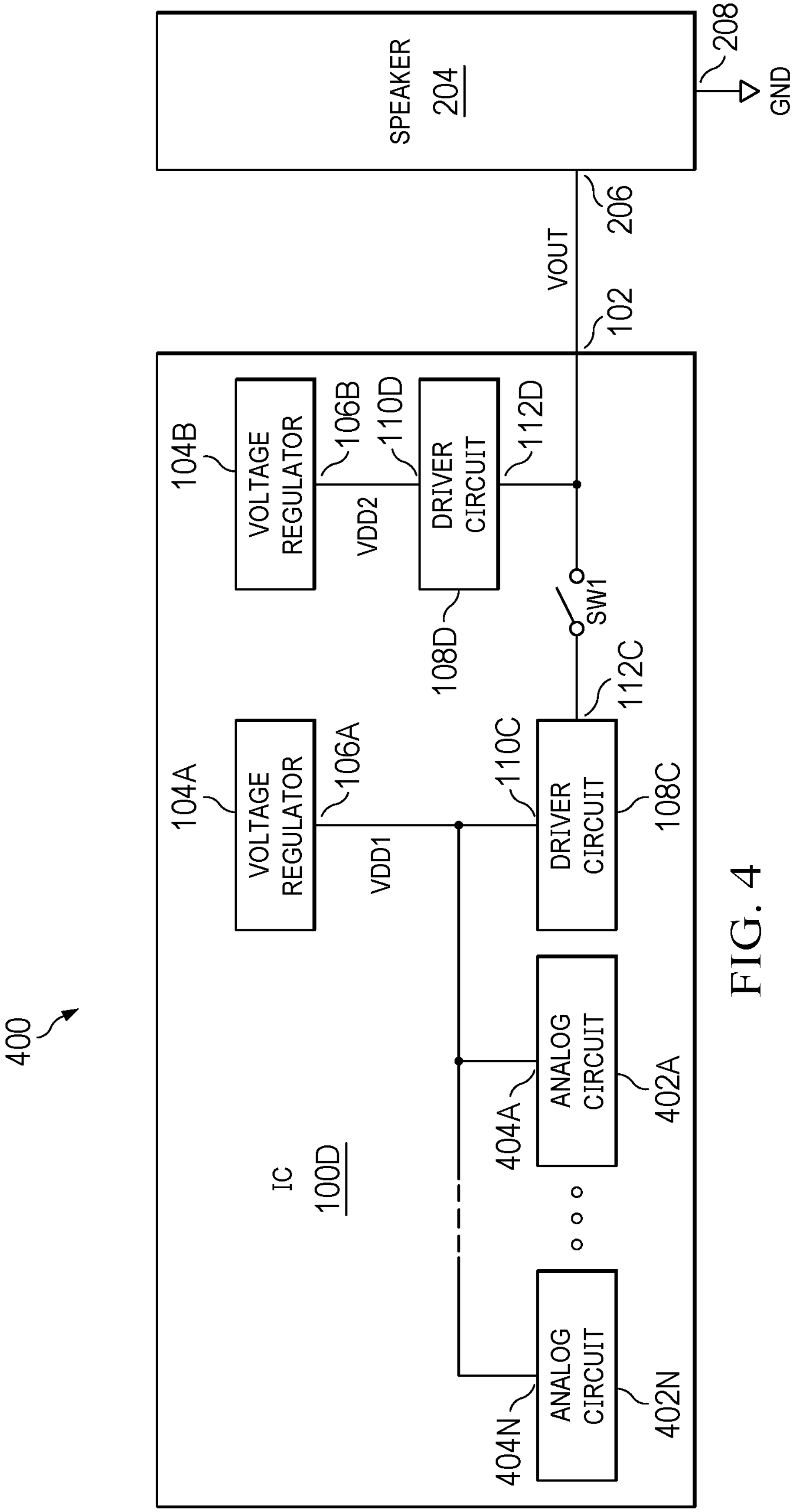

FIG. 4 is a diagram showing an example system 400 having driver circuits 108C and 108D with overcurrent control. As shown, the system 400 includes an IC 100D and the speaker 204. In the example of FIG. 4, the IC 100D is an example of the circuit 100 in FIG. 1, the IC 100A in FIG. 2, or the IC 100B in FIG. 3. The driver circuits 108C and 108D were described in FIG. 3 and are examples of the driver circuit 108 in FIG. 1, the driver circuit 108A or 108B in FIG. 2, or combinations thereof.

Besides the driver circuits 108C and 108D, the IC 100D includes the first voltage regulator 104A, the second voltage regulator, analog circuits 402A to 402N, and a switch SW1. Each of the analog circuits 402A to 402N has a respective terminal 404A to 404N. The terminals of the first voltage regulator 104A, the second voltage regulator 104B, the driver circuit 108C, and the driver circuit 108D were described in FIG. 3. The switch SW1 has a first terminal, a second terminal, and a control terminal.

In the example of FIG. 4, the driver circuit 108C shares the first voltage regulator 104A with analog circuits 402A to 402N. In other words, each respective terminal 404A to 404N of the analog circuits 402A to 402N is coupled to the second terminal 106A of the first voltage regulator 104A. Also, the first terminal 110C of the driver circuit 108C is coupled to the second terminal 106A of the first voltage regulator 104A. In other words, the driver circuit 108C and each of analog circuits 402A to 402N is powered by VDD1. In some examples, the analog circuits 402A to 402N may include a PWM modulator, a loop filter, digital-to-analog converter (DAC), and/or other analog circuits. When VDD1 is shared by the driver circuit 108C and the analog circuits 402A to 402N, the driver circuit 108C adds noise to VDD1, which may affect the overall performance of the IC 100D if the current from the driver circuit 108C is higher than a target current level. By restricting the current from the driver circuit 108C to below the target current level, the driver circuit 108C can share VDD1 with the analog circuits 402A to 402N without adding too much noise to VDD1 and/or otherwise interfering with the operations of the analog circuits 402A to 402N.

In the example of FIG. 4, the driver circuit 108D has its first terminal 110D coupled to the second terminal 106B of the second voltage regulator 104B such that the driver circuit 108D is powered by VDD2. As shown, the third terminal 112D of the driver circuit 108D is coupled to the second terminal 102 of the IC 100D. In contrast, the third terminal 112C of the driver circuit 108C is coupled to the second terminal 102 of the IC 100D via a switch SW1. The switch SW1 is an example of a transistor MCAS in FIG. 6 and is turned off when driver circuit 108D is in use to protect components of the driver circuit 108C from the current levels provided by the driver circuit 108D. In some examples, VDD2 is higher than VDD1 such that the driver circuit 108D provides more power at the second terminal 102 than the driver circuit 108C.

In the example of FIG. 4, the first terminal 206 of the speaker 204 is coupled to the second terminal 102 of the IC 100D, and the second terminal 208 of the speaker 204 is coupled to a ground terminal or ground. In other examples, the second terminal 208 of the speaker may be coupled to the output of another driver circuit as described herein.

In some examples, a circuit includes a driver circuit (e.g., the driver circuit 108) having a first terminal (e.g., the first terminal 110), a second terminal (e.g., the second terminal 111), and a third terminal (e.g., the third terminal 112). In such examples, the driver circuit includes a power stage (e.g., the power stage 170 in FIG. 1) having a first terminal (e.g., the first terminal 172 in FIG. 1), a second terminal (e.g., the second terminal 174 in FIG. 1), and a third terminal (e.g., the third terminal 176 in FIG. 1). The first terminal of the power stage is coupled to the first terminal of the driver circuit. The third terminal of the power stage is coupled to the third terminal of the driver circuit. In such examples, the power stage includes an output switch (e.g., the HS output switch 182 in FIG. 1) having a first terminal, a second terminal, and a control terminal. The first terminal of the output switch is coupled to the first terminal of the power stage. The second terminal of the output switch is coupled to the third terminal of the power stage. The control terminal of the output switch is coupled to the second terminal of the power stage. In such examples, the circuit also includes an overcurrent control circuit (e.g., the overcurrent control circuit 114 in FIG. 1) having a first terminal (e.g., the first terminal 116 in FIG. 1), a second terminal (e.g., the second terminal 118 in FIG. 1), and a third terminal (e.g., the third terminal 120 in FIG. 1). In such examples, the first terminal of the overcurrent control circuit is coupled to the second terminal of the power stage. The second terminal of the overcurrent control circuit is coupled to the third terminal of the power stage. The third terminal of the overcurrent control circuit is coupled to the second terminal of the driver circuit.

In some examples, the overcurrent control circuit including switch control circuitry (e.g., the HS switch control circuitry 128 and/or the LS switch control circuitry 134 in FIG. 1) and overcurrent detection circuitry (e.g., the overcurrent detection circuit 160 in FIG. 1). The switch control circuitry is configured to: receive a first control signal (e.g., PWM_IN in FIG. 1); and provide a second control signal (e.g., HS_CS or LS_CS in FIG. 1) to the control terminal of the output switch responsive to a delay interval relative to the first control signal and overcurrent detection results obtained by the overcurrent detection circuitry during the delay interval.

In some examples, the driver circuit (e.g., the driver circuit 108C in FIGS. 3 and 4, or related switches in FIG. 6) is a first driver circuit. The supply voltage is a first supply voltage (e.g., VDD1 in FIGS. 3, 4, and 6). The PWM control signal is a first PWM control signal (e.g., PWM_IN1 in FIG. 3). The output switch is a first output switch (e.g., $MHN_{MAIN}$ in FIG. 6). The circuit includes a second driver circuit (e.g., driver circuit 108D in FIGS. 3 and 4). The second driver circuit has a first terminal (e.g., the first terminal 110D in FIG. 3), a second terminal (e.g., the second terminal 111D in FIG. 3), and a third terminal (e.g., the third terminal 112 in FIG. 3). The second driver circuit has a second output switch (e.g., $MHP_{MAIN}$ in FIG. 6). In such examples, the second driver circuit operates to: receive a second supply voltage (e.g., VDD2 in FIGS. 3, 4, and 6) at its first terminal; receive a second PWM control signal (e.g., PWM_IN2 in FIG. 3) at its second terminal; and control the second output switch to provide an output voltage at its third terminal responsive to the second supply voltage, the second PWM control signal, and overcurrent detection results.

In some examples, the driver circuit includes half-bridge output switches including the output switch. In such examples, the driver circuit operates to control the half-bridge output switches to provide the output voltage at its third terminal responsive to the supply voltage, the PWM control signal, and the overcurrent detection results.

In some examples, the driver circuit includes full H-bridge output switches including the output switch. In such examples, the driver circuit operates to control the full H-bridge output switches to provide the output voltage at its third terminal responsive to the supply voltage, the PWM control signal, and the overcurrent detection results.

In some examples, the driver circuit includes multi-bridge output switches including the output switch. In such examples, the driver circuit operates to control the multi-bridge output switches to provide the output voltage at its third terminal responsive to the supply voltage, the PWM control signal, and the overcurrent detection results.

In some examples, a size ratio of the output switch relative to the auxiliary output switch is based on design factors such as the amount of current to be restricted in an overcurrent scenario, the loading demands of the load, a target resistance of an output switch when turned on. In some examples, the driver circuit operates to: turn on the auxiliary output switch responsive to the PWM control signal; obtain the overcurrent detection results; and after a delay interval, turn on the output switch responsive to the PWM control signal and the overcurrent detection results indicating there is no overcurrent condition.

Figure 5:
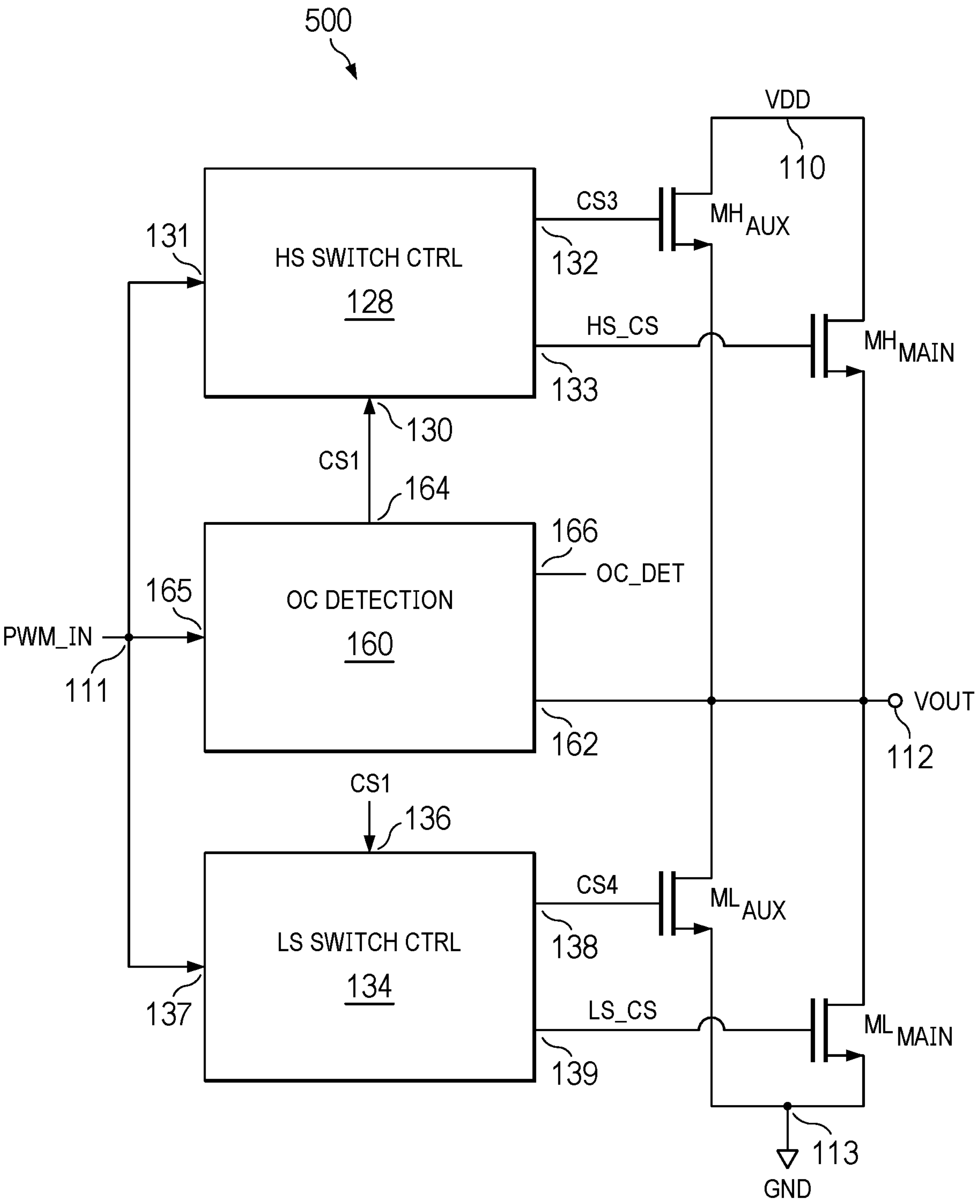
FIGS. 5 to 7 are diagrams showing example driver circuits with overcurrent control.
Figure 6:
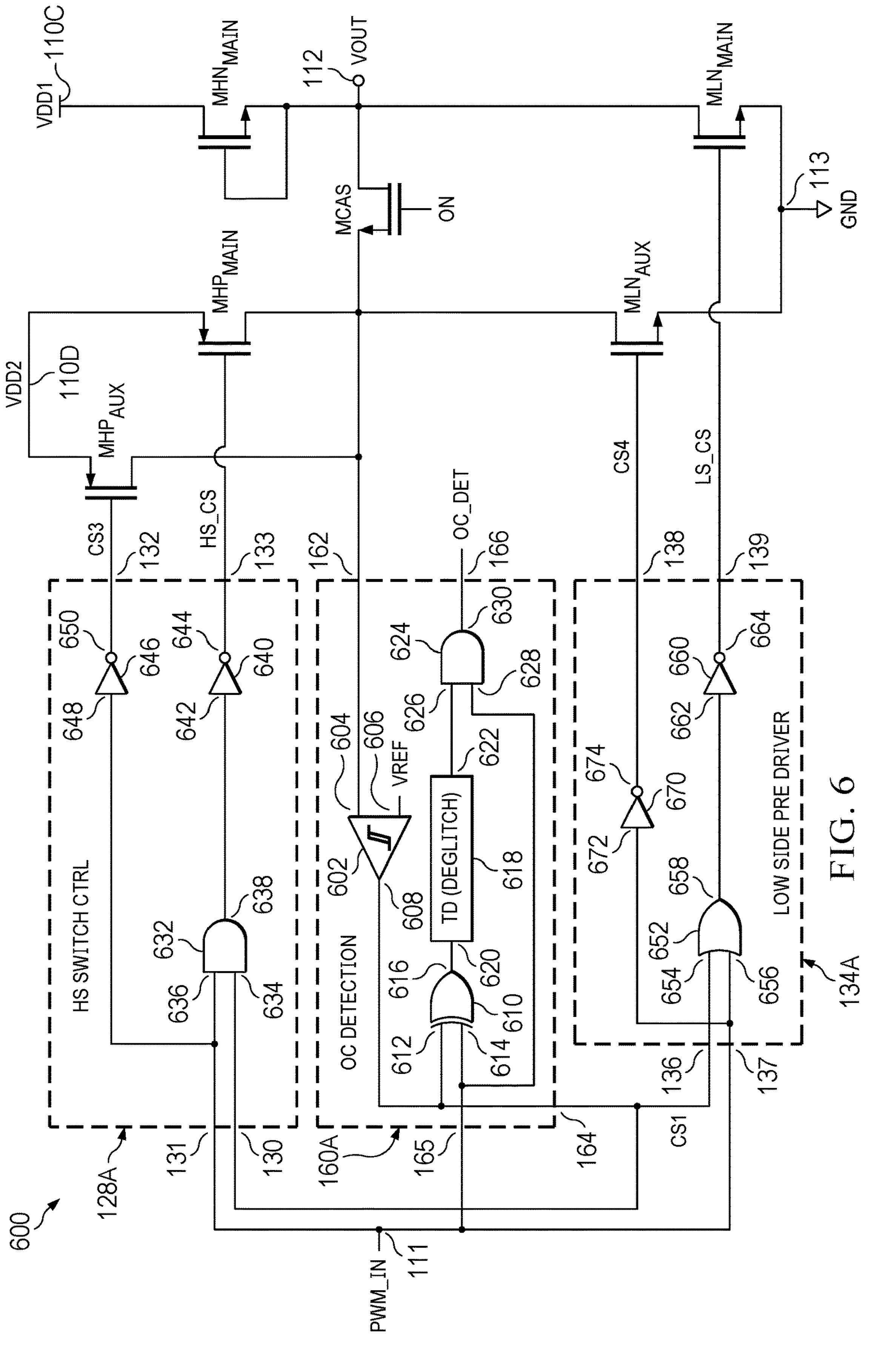
Figure 7:
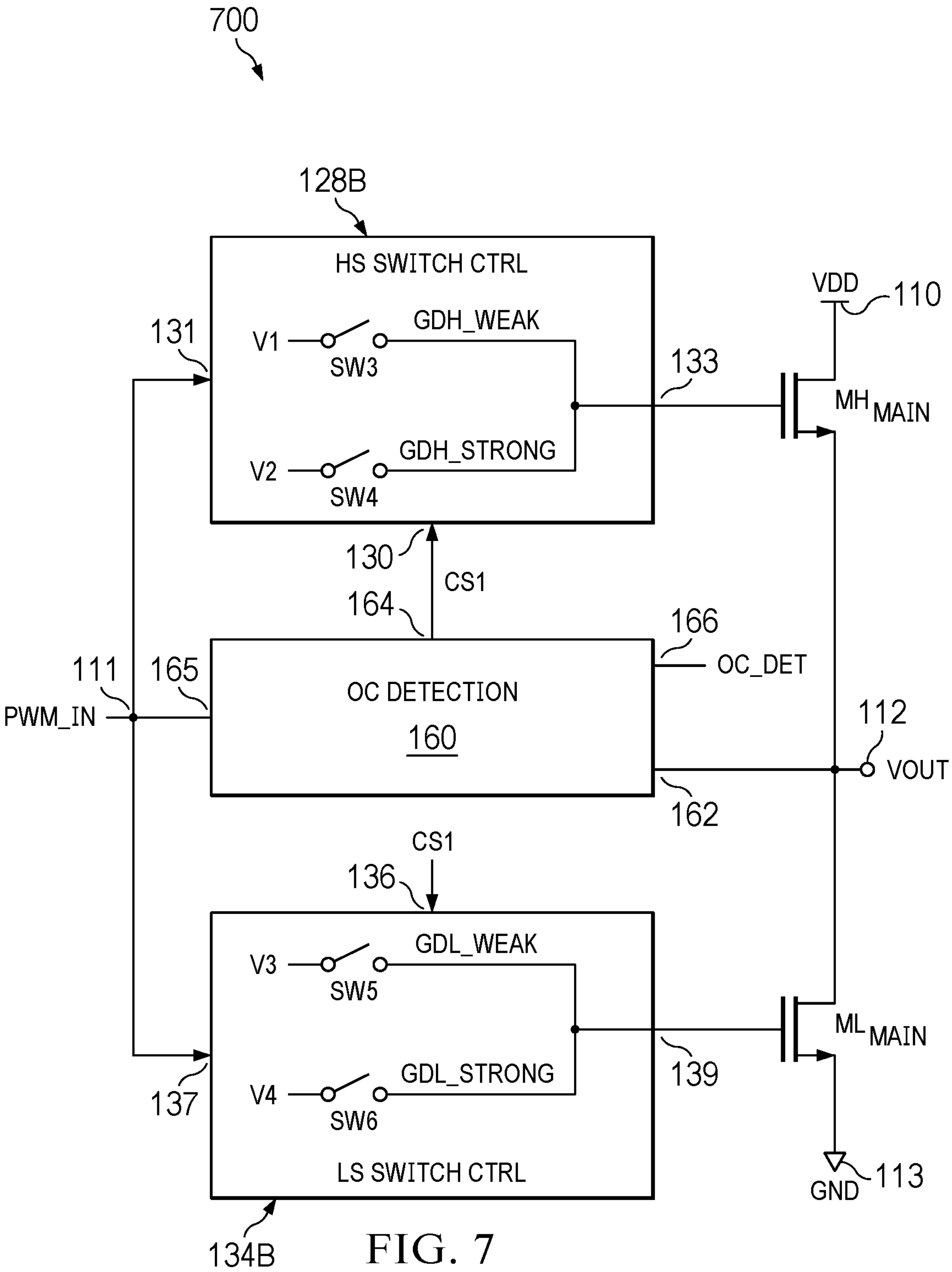

FIGS. 5 to 7 are diagrams showing example driver circuits 500, 600, and 700 with overcurrent control. In FIG. 5, the driver circuit 500 has the first terminal 110, the second terminal 111, the third terminal 112, and the fourth terminal 113, and includes the HS switch control circuitry 128, the OC detection circuitry 160, and the LS switch control circuitry 134 described in FIG. 1. The driver circuit 500 also includes transistors $MH_{AUX}$, $MH_{MAIN}$, $ML_{AUX}$, and $ML_{MAIN}$ in the arrangement shown. In the example of FIG. 5, each of the transistors $MH_{AUX}$, $MH_{MAIN}$, $ML_{AUX}$, and $ML_{MAIN}$ are n-channel field-effect transistors ("NFETs"), and each has a first terminal, a second terminal, and a control terminal. The transistor $MH_{AUX}$ is an example of the HS auxiliary output switch 140 in FIG. 1. The transistor $MH_{MAIN}$ is an example of the HS output switch 182 in FIG. 1. The transistor $ML_{AUX}$ is an example of the LS auxiliary output switch 148 in FIG. 1. The transistor $ML_{MAIN}$ is an example of the LS output switch 190 in FIG. 1.

As shown, the first terminals of the transistors $MH_{AUX}$ and $MH_{MAIN}$ are coupled to the first terminal 110 of the driver circuit 500. The second terminal of the transistor $MH_{AUX}$ is coupled to the first terminal of the transistor $ML_{AUX}$ and to the third terminal 112 of the driver circuit 500. The second terminal of the transistor $ML_{AUX}$ is coupled to the fourth terminal 113 of the driver circuit 500. The second terminal of the transistor $MH_{MAIN}$ is coupled to the first terminal of the transistor $ML_{MAIN}$ and to the third terminal 112 of the driver circuit 500. The second terminal of the transistor $ML_{MAIN}$ is coupled to the fourth terminal 113 of the driver circuit 500. The control terminal of the transistor $MH_{AUX}$ is coupled to the third terminal 132 of the HS switch control circuitry 128. The control terminal of the transistor $MH_{MAIN}$ is coupled to the fourth terminal 133 of the HS switch control circuitry 128. The control terminal of the transistor $ML_{AUX}$ is coupled to the third terminal of the LS switch control circuitry 134. The control terminal of the transistor $ML_{MAIN}$ is coupled to the fourth terminal 139 of the LS switch control circuitry 134.

As shown, the first terminal 162 of the OC detection circuitry 160 is coupled to the third terminal 112 of the driver circuit 500. The second terminal 164 of the OC detection circuitry 160 is coupled to the first terminal 130 of the HS switch control circuitry 128 and to the first terminal 136 of the LS switch control circuitry 134. The third terminal 165 of the OC detection circuitry 160 is coupled to the second terminal 111 of the driver circuit 500. The fourth terminal 166 of the OC detection circuitry 160 provides OC_DET. The second terminal 131 of the HS switch control circuitry 128 is coupled to the second terminal 111 of the driver circuit 500. The second terminal 137 of the LS switch control circuitry 134 is coupled to the second terminal 111 of the driver circuit 500.

The driver circuit 500 operates to: receive VDD at its first terminal 110; receive PWM_IN at its second terminal 111; and control an output switch (e.g., the transistor $MH_{MAIN}$ or the transistor $ML_{MAIN}$) and an auxiliary output switch (e.g., the transistor $MH_{AUX}$ or the transistor $ML_{AUX}$) to provide VOUT at its third terminal 112 responsive to VDD, PWM_IN, the operations of the OC detection circuitry 160, the operations of the HS switch control circuitry 128, and the operations of the LS switch control circuitry 134.

The OC detection circuitry 160 operates to: receive VOUT at its first terminal 162; compare VOUT to VREF to obtain comparison results; provide CS1 at its second terminal 164 responsive to the comparison results; receive PWM_IN at its third terminal 165; and provide OC_DET at its fourth terminal 166 responsive to PWM_IN and the comparison results.

The HS switch control circuitry 128 operates to: receive CS1 at its first terminal 130; receive PWM_IN at its second terminal 131; provide CS3 at its third terminal 132 responsive to PWM_IN; and, after a delay interval, provide HS_CS at its fourth terminal 133 responsive to PWM_IN and CS1. The LS switch control circuitry 134 operates to: receive CS1 at its first terminal 136; receive PWM_IN at its second terminal 137; provide CS4 at its third terminal 138 responsive to PWM_IN; and, after a delay interval, provide LS_CS at its fourth terminal 139 responsive to PWM_IN and CS1.

In the example of FIG. 5, the transistor $MH_{AUX}$ turns on and off responsive to CS3. When the transistor $MH_{AUX}$ is on, current flows from the first terminal 110 of the driver circuit 500 to the third terminal 112 of the driver circuit 500 and VOUT increases. The transistor $ML_{AUX}$ turns on and off responsive to CS4. When the transistor $ML_{AUX}$ is on, current flows from the third terminal 112 of the driver circuit 500 to the fourth terminal 113 of the driver circuit 500 and VOUT decreases.

When the transistor $MH_{MAIN}$ is on, current flows from the first terminal 110 of the driver circuit 500 to the third terminal 112 of the driver circuit 500 and VOUT increases. The transistor $ML_{MAIN}$ turns on and off responsive to LS_CS. When the transistor $ML_{MAIN}$ is on, current flows from the third terminal 112 of driver circuit 500 to the fourth terminal 113 of the driver circuit 500 and VOUT decreases.

In different examples, the topology of the driver circuit 500 may vary. In the example of FIG. 5, a half-bridge topology with two output switches is represented. In other examples, the driver circuit 500 may have a full-bridge topology with four output switches. In other examples, the driver circuit 500 may have a multi-bridge topology to support different loads efficiently. Regardless of the number of output switches in the driver circuit 500, a respective auxiliary output switch may be included in parallel with each output switch. For example, $MH_{AUX}$ is in parallel with $MH_{MAIN}$ between the first terminal 110 of the driver circuit 500 and the third terminal 112 of the driver circuit 500. As another example, $ML_{AUX}$ is in parallel with $ML_{MAIN}$ between the third terminal 112 of the driver circuit 500 and the fourth terminal 113 of the driver circuit 500. Additional output switches and respective auxiliary output switches may have similar parallel arrangements. Regardless of the particular arrangement, each auxiliary output switch is turned on before a respective output switch responsive to a control signal (e.g., PWM_IN or similar control signals) and overcurrent detection results are obtained. After a delay interval, each output switch is turned on responsive to a control signal (e.g., PWM_IN or similar control signals) and the overcurrent detection results (e.g., the VOUT to VREF comparison results and/or OC_DET) indicating there is no overcurrent condition.

In FIG. 6, the driver circuit 600 has the first terminal 110C, the first terminal 110D, the second terminal 111, the third terminal 112, and the fourth terminal 113, and includes HS switch control circuitry 128A, OC detection circuitry 160A, and LS switch control circuitry 134A. The HS switch control circuitry 128A is an example of the switch control circuitry 128 in FIG. 1. The OC detection circuitry 160A is an example of the OC detection circuitry 160 in FIG. 1. The LS switch control circuitry 134A is an example of the LS switch control circuitry 134 in FIG. 1. The driver circuit 600 also includes transistors $MHP_{AUX}$, $MHP_{MAIN}$, $MHN_{MAIN}$, $MLN_{AUX}$, $MLN_{MAIN}$, and MCAS in the arrangement shown.

In the example of FIG. 6, the OC detection circuitry 160 has a comparator 602, an XOR gate 610, a delay circuit 618, and an AND gate 624. The comparator 602 has a first terminal 604, a second terminal 606, and a third terminal 608. The XOR gate 610 has a first terminal 612, a second terminal 614, and a third terminal 616. The delay circuit 618 has a first terminal 620 and a second terminal 622. The AND gate 624 has a first terminal 626, a second terminal 628, and a third terminal 630.

The HS switch control circuitry 128A includes an AND gate 632, a first inverter 640, and a second inverter 646. The AND gate 632 has a first terminal 634, a second terminal 636, and a third terminal 638. The first inverter 640 has a first terminal 642 and a second terminal 644. The second inventor 646 has a first terminal 648 and a second terminal 650.

The LS switch control circuitry 134A includes an OR gate 652, a first inverter 660, and a second inverter 670. The OR gate 652 has a first terminal 654, a second terminal 656, and a third terminal 658. The first inverter 660 has a first terminal 662 and a second terminal 664. The second inventor 670 has a first terminal 672 and a second terminal 674.

In the example of FIG. 6, each of the transistors $MHP_{AUX}$ and $MHP_{MAIN}$, are p-channel field-effect transistors ("PFETs"), and each has a first terminal, a second terminal, and a control terminal. Each of the transistors $MHN_{MAIN}$, $MLN_{AUX}$, $MLN_{MAIN}$, and MCAS are NFETs, and each has a first terminal, a second terminal, and a control terminal. The transistor $MHP_{AUX}$ is an example of an HS auxiliary output switch 140 in FIG. 1. The transistor $MHP_{MAIN}$ is an example of an HS output switch of the power stage 170 in FIG. 1. The transistor $MHN_{MAIN}$ is an example of an HS output switch of the power stage 170 in FIG. 1. The transistor $MLN_{AUX}$ is an example of the LS auxiliary output switch 148 in FIG. 1. The transistor $MLN_{MAIN}$ is an example of an LS output switch of the power stage 170 in FIG. 1.

As shown, the first terminals of the transistors $MHP_{AUX}$ and $MHP_{MAIN}$ are coupled to the first terminal 110D of the driver circuit 600. The second terminals of the transistors $MHP_{AUX}$ and $MHP_{MAIN}$ are coupled to the first terminal of the transistor $MLN_{AUX}$. The second terminal of the transistor $MLN_{AUX}$ is coupled to the fourth terminal 113 of the driver circuit 600. The first terminal of the transistor $MHN_{MAIN}$ is coupled to the first terminal 110C of the driver circuit 600. The second terminal of the transistor $MHN_{MAIN}$ is coupled to the first terminal of the transistor $MLN_{MAIN}$ and to the third terminal 112 of the driver circuit 600. The second terminal of the transistor $MLN_{MAIN}$ IS coupled to the fourth terminal 113 of the driver circuit 600. As shown, the first terminal of the transistor MCAS is coupled to the first terminal 162 of the OC detection circuitry 160, and the second terminal of the transistor MCAS is coupled to the third terminal 112 of the driver circuit 600.

In the example of FIG. 6, the first terminal 162 of the OC detection circuitry 160A is coupled to the first terminal 604 of the comparator 602. The second terminal 606 of the comparator 602 is coupled to a VREF source (not shown) and receives VREF. The third terminal 608 of the comparator 602 is coupled to the first terminal 612 of the XOR gate 610 and to the second terminal 164 of the OC detection circuitry 160A. The second terminal 614 of the XOR gate 610 is coupled to the third terminal 165 of the OC detection circuitry 160A. The third terminal 616 of the XOR gate 610 is coupled to the first terminal 620 of the delay circuit 618. The second terminal 622 of the delay circuit is coupled to the first terminal 626 of the AND gate 624. The second terminal 628 of the AND gate 624 is coupled to the third terminal 165 of the OC detection circuitry 160A. The third terminal 630 of the AND gate 624 is coupled to the fourth terminal 166 of the OC detection circuitry 160A.

The first terminal 130 of the HS switch control circuitry 128A is coupled to the first terminal 634 of the AND gate 632. The second terminal 131 of the HS switch control circuitry 128A is coupled to the second terminal 636 of the AND gate 632 and to the first terminal 648 of the second inverter 646. The second terminal 650 of the second inverter 646 is coupled to the third terminal 132 of the HS switch control circuitry 128A. The third terminal 638 of the AND gate 632 is coupled to the first terminal 642 of the first inverter 640. The second terminal 644 of the first inverter 640 is coupled to the fourth terminal 133 of the HS switch control circuitry 128A.

The first terminal 136 of the LS switch control circuitry 134A is coupled to the first terminal 654 of the OR gate 652. The second terminal 137 of the LS switch control circuitry 134A is coupled to the second terminal 656 of the OR gate 652. The third terminal 658 of the OR gate 652 is coupled to the first terminal 662 of the first inverter 660. The second terminal 664 of the first inverter 660 is coupled to the fourth terminal 139 of the LS switch control circuitry 134A. The first terminal 672 of the second inverter 670 is coupled to the second terminal 137 of the LS switch control circuitry 134A. The second terminal 674 of the second inverter 670 is coupled to the third terminal 138 of the LS switch control circuitry 134A.

The driver circuit 600 operates to: receive VDD1 at its first terminal 110C; receive VDD2 at its first terminal 110D; receive PWM_IN at its second terminal 111; and control an output switch (e.g., the transistor $MHP_{MAIN}$, the transistor $MHN_{MAIN}$, or the transistor $MLN_{MAIN}$) and an auxiliary output switch (e.g., the transistor $MHP_{AUX}$ or the transistor $MLN_{AUX}$) to provide VOUT at its third terminal 112 responsive to the VDD1 and/or VDD2, PWM_IN, the operations of the OC detection circuitry 160A, the operations of the HS switch control circuitry 128A, and the operations of the LS switch control circuitry 134A.

The OC detection circuitry 160A operates to: receive VOUT at its first terminal 162; compare VOUT to VREF to obtain comparison results; provide CS1 at its second terminal 164 responsive to the comparison results; receive PWM_IN at its third terminal 165; and provide OC_DET at its fourth terminal 166 responsive to PWM_IN and the comparison results. More specifically, the comparator 602 is used to obtain the comparison results responsive to VOUT and VREF. CS1 at the second terminal 164 may be equal to or based on the comparison results. OC_DET is provided to the fourth terminal 166 of the OC detection circuitry 160A responsive to the operations of the XOR gate 610, the delay circuit 618, and the AND gate 624. For example, if PWM_IN is asserted and the comparison results indicate VOUT is less than VREF (e.g., the comparison results=a logical 0), the output XOR gate will be a logical 1. If PWM_IN is still asserted after the delay provided by the delay circuit 618, the output of the AND gate 624 will be OC_DET=a logical 1 (e.g., an overcurrent condition has been detected). As used herein, a signal that is "asserted" refers to the signal having a voltage level above a threshold. Meanwhile, a signal that is "de-asserted" refers to the signal having a voltage level below the threshold. In other words, an asserted signal is interpreted as a logical 1 and a de-asserted signal is interpreted as a logical 0.

The HS switch control circuitry 128A operates to: receive CS1 at its first terminal 130; receive PWM_IN at its second terminal 131; provide CS3 at its third terminal 132 responsive to PWM_IN; and provide HS_CS at its fourth terminal 133 responsive to PWM_IN and CS1. When PWM_IN is a logical 1, CS3 is a logical 0 due to the operations of the second inverter 646, and $MHP_{AUX}$ is turned on. When PWM_IN is a logical 0, CS3 is a logical 1 due to the operations of the second inverter 646, and $MHP_{AUX}$ is turned off. When PWM_IN is a logical 1 and CS1 is a logical 1, HS_CS is a logical 0 due to the operations of the AND date 632 and first inverter 640. When HS_CS is a logical 0, $MHP_{MAIN}$ is turned on. When PWM_IN is a logical 0 or CS1 is a logical 0, HS_CS is a logical 1 due to the operations of the AND date 632 and first inverter 640. When HS_CS is a logical 1, $MHP_{MAIN}$ is turned off.

The LS switch control circuitry 134A operates to: receive CS1 at its first terminal 136; receive PWM_IN at its second terminal 137; provide CS4 at its third terminal 138 responsive to PWM_IN; and provide HS_CS at its fourth terminal 139 responsive to PWM_IN and CS1. When PWM_IN is a logical 1, CS4 is a logical 0 due to the operations of the second inverter 670, and $MLN_{AUX}$ is turned off. When PWM_IN is a logical 0, CS4 is a logical 1 due to the operations of the second inverter 670, and $MLN_{AUX}$ is turned on. When PWM_IN is a logical 1 or CS1 is a logical 1, LS_CS is a logical 0 due to the operations of the OR date 652 and first inverter 660. When LS_CS is a logical 0, $MLN_{MAIN}$ is turned off. When PWM_IN is a logical 0 and CS1 is a logical 0, LS_CS is a logical 1 due to the operations of the OR date 652 and the first inverter 660. When LS_CS is a logical 1, $MLN_{MAIN}$ is turned on.

In the example of FIG. 6, the transistor $MHP_{AUX}$ turns on and off responsive to CS3. When the transistor $MHP_{AUX}$ is on, current flows from the first terminal 110D of the driver circuit 600 to the third terminal 112 of the driver circuit 600 via the transistor MCAS and VOUT increases. The transistor $MLN_{AUX}$ turns on and off responsive to CS4. When the transistor $MLN_{AUX}$ is on, current flows from the third terminal 112 of the driver circuit 600 to the fourth terminal 113 of the driver circuit 600 via the transistor MCAS and VOUT decreases.

When the transistor $MHP_{MAIN}$ is on, current flows from the first terminal 110D of the driver circuit 600 to the third terminal 112 of the driver circuit 600 via the transistor MCAS and VOUT increases. The transistor $MLN_{MAIN}$ turns on and off responsive to LS_CS. When the transistor $MLN_{MAIN}$ is on, current flows from the third terminal 112 of driver circuit 600 to the fourth terminal 113 of the driver circuit 600 and VOUT decreases.

In the example of FIG. 6, the transistor $MHN_{MAIN}$ may be turned on/off responsive to another control signal (not shown). When the transistor $MHN_{MAIN}$ is on, current flows from the first terminal 110C to the third terminal 112 of the driver circuit 600 and VOUT increases. In some examples, the transistors $MHP_{MAIN}$ and $MHP_{AUX}$ are low voltage PFETs. In such examples, when VOUT is based on VDD1, the transistor MCAS is turned off to protect the transistors $MHP_{MAIN}$ and $MHP_{AUX}$ from the higher voltage at the third terminal 112. In other words, VOUT may be based on VDD1 in some scenarios. In other scenarios, VOUT is based on VDD2.

In different examples, the topology of the driver circuit 600 may vary. In the example of FIG. 6, a multi-bridge topology is represented. In some examples, a respective auxiliary output switch is included in parallel with each output switch. For example, $MHP_{AUX}$ is in parallel with $MHP_{MAIN}$ between the first terminal 110D of the driver circuit 600 and the third terminal 112 of the driver circuit 600. As another example, $MLN_{AUX}$ is in parallel with $MLN_{MAIN}$ between the third terminal 112 of the driver circuit 600 and the fourth terminal 113 of the driver circuit 600. In other examples, some output switches may include an auxiliary output switch in parallel, while some do not include an auxiliary output switch. For example, $MHN_{MAIN}$ does not have a respective auxiliary output switch in parallel with it between the first terminal 110C of the driver circuit 600 and the third terminal 112 of the driver circuit 600. Regardless of the particular arrangement, each auxiliary output switch included is turned on before a respective output switch responsive to a control signal (e.g., PWM_IN or similar control signals) and overcurrent detection results are obtained. After a delay interval, each output switch is turned on responsive to a control signal (e.g., PWM_IN or similar control signals) and the overcurrent detection results (e.g., the VOUT to VREF comparison results and/or OC_DET) indicating there is no overcurrent condition.

In FIG. 7, the driver circuit 700 has the first terminal 110, the second terminal 111, the third terminal 112, and the fourth terminal 113, and includes HS switch control circuitry 128B, the OC detection circuitry 160, and LS switch control circuitry 134B. The driver circuit 700 also includes transistors $MH_{MAIN}$ and $ML_{MAIN}$ in the arrangement shown. In the example of FIG. 7, each of the transistors $MH_{MAIN}$ and $ML_{MAIN}$ are NFETs, and each has a first terminal, a second terminal, and a control terminal. The transistor $MH_{MAIN}$ is an example of the HS output switch 182 in FIG. 1. The transistor $ML_{MAIN}$ is an example of the LS output switch 190 in FIG. 1.

The HS switch control circuitry 128B has the first terminal 130, the second terminal 131, and the fourth terminal 133 described in FIG. 1. In the example of FIG. 7, the HS switch control circuitry 128B includes switches SW3 and SW4. The HS switch control circuitry 128B may also include circuitry (not shown) to control the switches SW3 and SW4. The LS switch control circuitry 134B has the first terminal 136, the second terminal 137, and the fourth terminal 139 described in FIG. 1. In the example of FIG. 7, the LS switch control circuitry 134B includes switches SW5 and SW6. The LS switch control circuitry 134B may also include circuitry (not shown) to control the switches SW5 and SW6.

As shown, the first terminal of $MH_{MAIN}$ is coupled to the first terminal 110 of the driver circuit 700. The second terminal of the transistor $MH_{MAIN}$ is coupled to the first terminal of the transistor $ML_{MAIN}$ and to the third terminal 112 of the driver circuit 700. The second terminal of the transistor $ML_{MAIN}$ is coupled to the fourth terminal 113 of the driver circuit 700.

As shown, the first terminal 162 of the OC detection circuitry 160 is coupled to the third terminal 112 of the driver circuit 700. The second terminal 164 of the OC detection circuitry 160 is coupled to the first terminal 130 of the HS switch control circuitry 128 and to the first terminal 136 of the LS switch control circuitry 134. The third terminal 165 of the OC detection circuitry 160 is coupled to the second terminal 111 of the driver circuit 700. The fourth terminal 166 of the OC detection circuitry 160 provides OC_DET. The second terminal 131 of the HS switch control circuitry 128 is coupled to the second terminal 111 of the driver circuit 700. The second terminal 137 of the LS switch control circuitry 134 is coupled to the second terminal 111 of the driver circuit 700.

The driver circuit 700 operates to: receive VDD at its first terminal 110; receive PWM_IN at its second terminal 111; and control an output switch (e.g., the transistor $MH_{MAIN}$ or the transistor $ML_{MAIN}$) to provide VOUT at its third terminal 112 responsive to VDD, PWM_IN, the operations of the OC detection circuitry 160, the operations of the HS switch control circuitry 128B, and the operations of the LS switch control circuitry 134B.

The OC detection circuitry 160 operates to: receive VOUT at its first terminal 162; compare VOUT to VREF to obtain comparison results; provide CS1 at its second terminal 164 responsive to the comparison results; receive PWM_IN at its third terminal 165; and provide OC_DET at its fourth terminal 166 responsive to PWM_IN and the comparison results.

The HS switch control circuitry 128B operates to: receive CS1 at its first terminal 130; receive PWM_IN at its second terminal 131; provide a weak gate control signal (GDH_WEAK) at its fourth terminal 133 responsive to PWM_IN being asserted, CS1 having a first state (e.g., a logical 0 state), and V1; and provide a strong gate control signal (GDH_STRONG) at its fourth terminal 133 responsive to PWM_IN being asserted, CS1 having a second state (e.g., a logical 1 state), and V2. As used herein, a "weak gate control signal" refers to a gate control signal that partially turns on a respective switch (e.g., 40%, 50%, 60%, or some other partial on-state). As used herein, a "strong gate control signal" refers to a gate control signal that fully turns on (saturation state) a respective transistor. For n-channel transistors, a higher voltage gate control signal will be stronger. For p-channel transistors, a lower voltage gate control signal will be stronger.

The LS switch control circuitry 134B operates to: receive CS1 at its first terminal 136; receive PWM_IN at its second terminal 137; provide a weak gate control signal (GDL_WEAK) at its fourth terminal 139 responsive to PWM_IN being de-asserted, CS1 having the second state (e.g., a logical 1 state), and V3; and provide a strong gate control signal (GDL_STRONG) at its fourth terminal 139 responsive to PWM_IN being de-asserted, CS1 having the first state (e.g., a logical 0 state), and V4.

In the example of FIG. 5, the transistor $MH_{MAIN}$ turns on and off responsive to GDH_WEAK or GDH_STRONG. When the transistor $MH_{MAIN}$ is on, current flows from the first terminal 110 of the driver circuit 700 to the third terminal 112 of the driver circuit 700 and VOUT increases. The transistor $ML_{MAIN}$ turns on and off responsive to GDH_WEAK or GDH_STRONG. When the transistor $ML_{MAIN}$ is on, current flows from the third terminal 112 of the driver circuit 700 to the fourth terminal 113 of the driver circuit 700 and VOUT decreases.

In different examples, the topology of the driver circuit 700 may vary. In the example of FIG. 7, a half-bridge topology with two output switches is represented. In other examples, the driver circuit 700 may have a full-bridge topology with four output switches. In other examples, the driver circuit 700 may have a multi-bridge topology to support different loads efficiently. Regardless of the number of output switches in the driver circuit 700, weak and strong gate control options are provided for each output switch. With this arrangement, each output switch is initially turned on using a weak gate control signal (e.g., GDH_WEAK or GDL_WEAK in FIG. 7) responsive to a control signal (e.g., PWM_IN or similar control signals) and overcurrent detection results are obtained. After a delay interval, each output switch may be turned on more fully by a strong gate control signal (e.g., GDH_STRONG or GDL_STRONG in FIG. 7) responsive to a control signal (e.g., PWM_IN or similar control signals) and the overcurrent detection results (e.g., the VOUT to VREF comparison results and/or OC_DET) indicating there is no overcurrent condition. If there is an overcurrent condition, the driver circuit 700 and/or related components may be shut down to prevent $MH_{MAIN}$ and/or $ML_{MAIN}$ from being damaged by the overcurrent condition.

Figure 8:
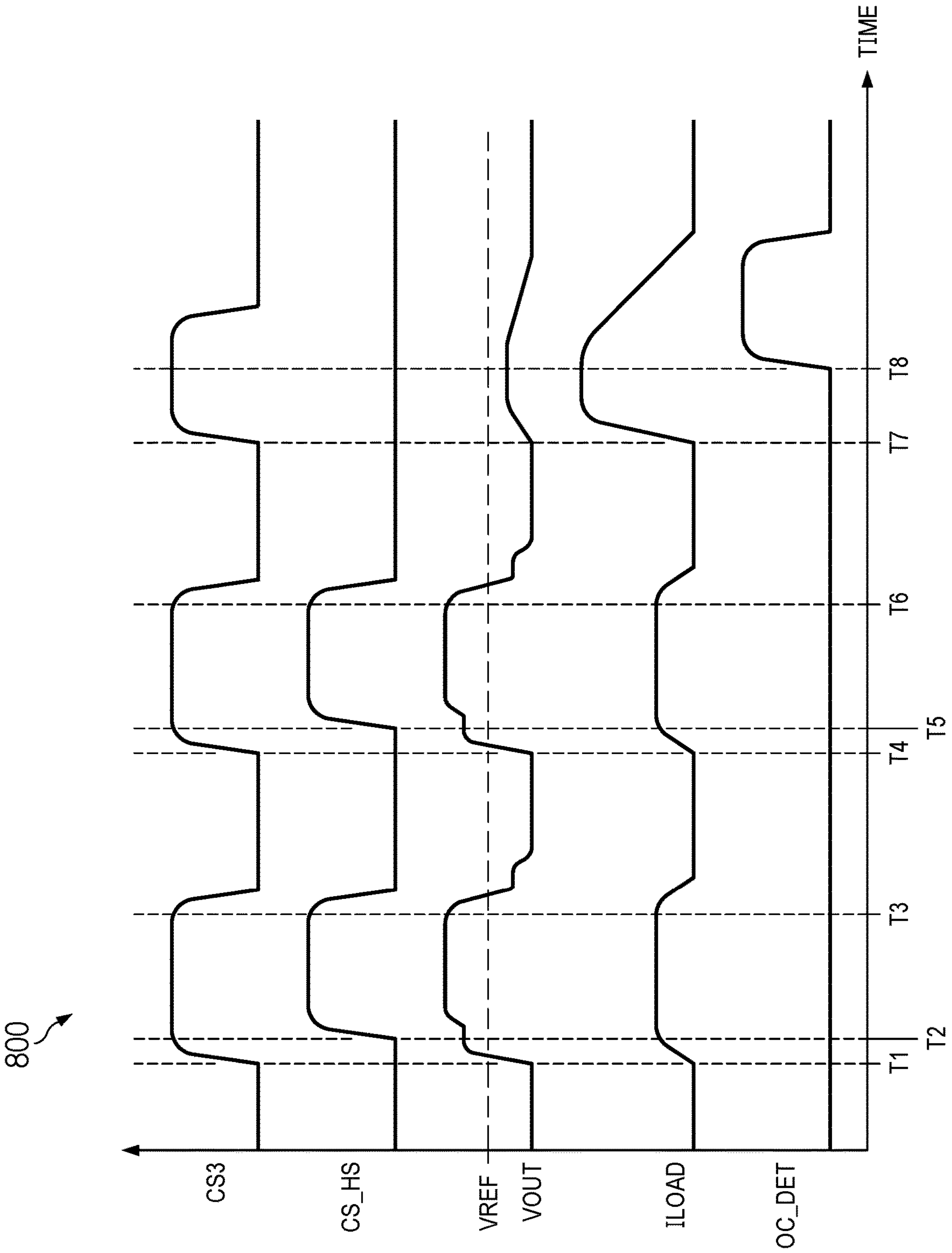
FIG. 8 is a timing diagram showing example driver circuit signals.

FIG. 8 is a timing diagram 800 showing example driver circuit signals with and without an overcurrent condition. In the timing diagram 800, the example driver circuit signals include CS3, CS_HS, VREF, VOUT, a load current (ILOAD), and OC_DET. At time T1, CS3 is asserted (turning on a HS auxiliary output switch). In some examples, CS3 is asserted at time T1 responsive to a control signal (not shown), such as PWM_IN, being asserted. When CS3 is asserted, VOUT and ILOAD increase. At time T2, VOUT is greater than VREF indicating there is no overcurrent condition. Accordingly, CS_HS is asserted (turning on a HS output switch) at time T2, resulting in VOUT and ILOAD increasing up to respective target levels. At time T3, CS3, CS_HS, VOUT, and ILOAD are de-asserted. In some examples, CS3, CS_HS, VOUT, and ILOAD are de-asserted at time T3 responsive to a control signal (not shown), such as PWM_IN, being de-asserted.

At time T4, CS3 is asserted again (turning on a HS auxiliary output switch). In some examples, CS3 is asserted at time T4 responsive to a control signal (not shown), such as PWM_IN, being asserted. When CS3 is asserted, VOUT and ILOAD increase. At time T5, VOUT is greater than VREF indicating there is no overcurrent condition. Accordingly, CS_HS is asserted (turning on a HS output switch) at time T5, resulting in VOUT and ILOAD increasing up to respective target levels. At time T6, CS3, CS_HS, VOUT, and ILOAD are de-asserted. In some examples, CS3, CS_HS, VOUT, and ILOAD are de-asserted at time T6 responsive to a control signal (not shown), such as PWM_IN, being de-asserted.

At time T7, CS3 is asserted again (turning on a HS auxiliary output switch). In some examples, CS3 is asserted at time 17 responsive to a control signal (not shown), such as PWM_IN, being asserted. When CS3 is asserted, VOUT and ILOAD increase. After time T7, VOUT stays below VREF indicating there is an overcurrent condition and ILOAD (through the HS auxiliary output) increases beyond the normal levels shown between times T2 to T3 and between times T5 to T6. Due to the overcurrent condition and/or comparison results of VOUT and VREF, CS_HS is not asserted. If VOUT stays below VREF for some time (e.g., from time T7 to T8), OC_DET is asserted. Responsive to OC_DET being asserted, CS3 is eventually de-asserted, resulting in ILOAD and VOUT decreasing.

Figure 9:
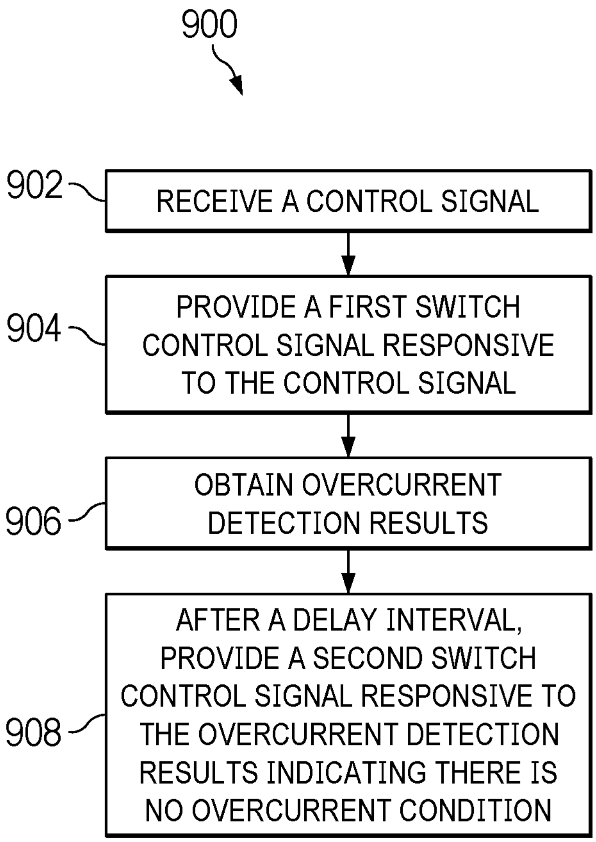
FIG. 9 is a flowchart showing an example driver circuit method.

FIG. 9 is a flowchart showing an example driver circuit method 900. In the example of FIG. 9, the method 900 includes receiving a control signal (e.g., PWM_IN) at block 902. At block 904, a first switch control signal (e.g., CS3 or GDH_WEAK) is provided responsive to the control signal.

At block 906, overcurrent detection results are obtained. At block 908, after a delay interval, a second switch control signal (CS_HS or GDH_STRONG) is provided responsive to the overcurrent detection results indicating there is no overcurrent condition.

In some examples, the driver circuit includes an output switch (e.g., HS output switch 182, $MH_{MAIN}$, or $MHP_{MAIN}$), the first and second switch control signals (GDH_WEAK and GDH_STRONG) are provided to a control terminal of the output switch, and the second switch control signal is stronger than the first switch control signal. In some examples, the driver circuit includes an output switch (e.g., HS output switch 182, $MH_{MAIN}$, or $MHP_{MAIN}$) and an auxiliary output switch (e.g., the HS auxiliary output switch 140, the LS auxiliary output switch 148, $MHP_{AUX}$, or $MLN_{AUX}$) in parallel with the output switch. In such examples, the first switch control signal (e.g., CS3) is provided to a control terminal of the auxiliary output switch. The second switch control signal (e.g., CS_HS) is provided to a control terminal of the output switch. In some examples, obtaining the overcurrent detection results includes: receiving VOUT of the driver circuit; comparing VOUT to VREF; and, if VOUT is greater than VREF, providing comparison results indicating there is no overcurrent condition.

In some examples, the output switch is a high-side output switch, and the auxiliary output switch is a high-side auxiliary output switch. In such examples, the method 900 may include: turning on a high-side auxiliary output switch responsive to the control signal; obtaining overcurrent detection results; and after a delay interval, turning on a high-side output switch in parallel with the high-side auxiliary output switch responsive to the overcurrent detection results indicating there is no overcurrent condition.

In some examples, the output switch is a low-side output switch, and the auxiliary output switch is a low-side auxiliary output switch. In such examples, the method 900 may include: turning on a low-side auxiliary output switch responsive to the control signal; obtaining overcurrent detection results; and after a delay interval, turning on a low-side output switch in parallel with the low-side auxiliary output switch responsive to the overcurrent detection results indicating there is no overcurrent condition.

In some examples, the output switch is one switch in a set of full-bridge topology switches and each output switch has a respective auxiliary output switch in parallel. In such examples, the method 900 may include: turning on each auxiliary output switch responsive to a respective control signal; obtaining overcurrent detection results; and after a delay interval, turning on a respective output switch responsive to the overcurrent detection results indicating there is no overcurrent condition.

In some examples, the output switch is one switch in a set of multi-bridge topology switches and each output switch has a respective auxiliary output switch in parallel. In such examples, the method may include: turning on each auxiliary output switch responsive to a respective control signal; obtaining overcurrent detection results; and after a delay interval, turning on a respective output switch responsive to the overcurrent detection results indicating there is no overcurrent condition.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field-effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:

a driver circuit having a first terminal, a second terminal, and a third terminal, the driver circuit including:

a power stage having a first terminal, a second terminal, and a third terminal, the first terminal of the power stage coupled to the first terminal of the driver circuit, the third terminal of the power stage coupled to the third terminal of the driver circuit, the power stage including an output switch having a first terminal, a second terminal, and a control terminal, the first terminal of the output switch coupled to the first terminal of the power stage, the second terminal of the output switch coupled to the third terminal of the power stage, and the control terminal of the output switch coupled to the second terminal of the power stage; and an overcurrent control circuit having a first terminal, a second terminal, and a third terminal, the first terminal of the overcurrent control circuit coupled to the second terminal of the power stage, the second terminal of the overcurrent control circuit coupled to the third terminal of the power stage, the third terminal of the overcurrent control circuit coupled to the second terminal of the driver circuit, the overcurrent control circuit including:

overcurrent detection circuitry having a first terminal, a second terminal, a third terminal, and a fourth terminal, the overcurrent detection circuitry configured to receive a first control signal on the third terminal of the overcurrent detection circuitry, and provide an overcurrent detection signal at the fourth terminal of the overcurrent detection circuitry responsive to the first control signal; and switch control circuitry having a first terminal, a second terminal, and a third terminal, the first terminal of the switch control circuitry coupled to the second terminal of the overcurrent detection circuitry, the second terminal of the switch control circuitry coupled to the third terminal of the overcurrent detection circuitry, and the third terminal of the switch control circuitry coupled to the first terminal of the overcurrent control circuit, wherein the switch control circuitry is configured to:

receive the first control signal on the second terminal of the switch control circuitry; and provide a second control signal to the control terminal of the output switch responsive to a delay interval relative to the first control signal and overcurrent detection results obtained by the overcurrent detection circuitry during the delay interval.

2. The circuit of claim 1, wherein the switch control circuitry includes a first switch and a second switch, and the switch control circuitry is configured to:

provide a third control signal to the control terminal of the output switch via the first switch responsive to the first control signal; and provide the second control signal to the control terminal of the output switch via the second switch, the second control signal being stronger than the third control signal.

3. The circuit of claim 1, wherein the overcurrent control circuit further has a fourth terminal, and the overcurrent control circuit includes an auxiliary output switch having a first terminal, a second terminal, and a control terminal, the first terminal of the auxiliary output switch coupled to the fourth terminal of the overcurrent control circuit, the second terminal of the auxiliary output switch coupled to the second terminal of the overcurrent control circuit.

4. The circuit of claim 3, wherein the output switch is a high-side output switch, the auxiliary output switch is a high-side auxiliary output switch, the switch control circuitry includes high-side switch control circuitry having a first terminal, a second terminal, a third terminal, and a fourth terminal, the overcurrent control circuit includes a low-side auxiliary output switch and low-side switch control circuitry having a first terminal, a second terminal, a third terminal, and a fourth terminal, the power stage has a fourth terminal and a fifth terminal, the power stage includes a low-side output switch, the low-side output switch has a first terminal, a second terminal, and a control terminal, the first terminal of the low-side output switch is coupled to the third terminal of the power stage, the second terminal of the low-side output switch is coupled to the fifth terminal of the power stage, and the control terminal of the low-side output switch is coupled to the fourth terminal of the power stage.

5. The circuit of claim 4, wherein the overcurrent control circuit has a fifth terminal and a sixth terminal, the fifth terminal of the overcurrent control circuit coupled to the fourth terminal of the power stage, the low-side auxiliary output switch has a first terminal, a second terminal, and a third terminal, the first terminal of the low-side auxiliary output switch coupled to the third terminal of the overcurrent control circuit, the second terminal of the low-side auxiliary output switch coupled to the sixth terminal of the overcurrent control circuit.

6. The circuit of claim 4, wherein the third terminal of the overcurrent detection circuitry is coupled to the third terminal of the power stage and the second terminal of the overcurrent detection circuitry is coupled to the first terminal of the high-side switch control circuitry and the first terminal of the low-side switch control circuitry.

7. The circuit of claim 6, wherein the overcurrent detection circuitry includes a comparator, an XOR gate, a delay circuit, and an AND gate, the comparator having a first terminal, a second terminal, and a third terminal, the first terminal of the comparator coupled to the third terminal of the overcurrent detection circuitry, the third terminal of the comparator coupled to the second terminal of the overcurrent detection circuitry, the XOR gate having a first terminal, a second terminal, and a third terminal, the first terminal of the XOR gate coupled to the third terminal of the comparator, the second terminal of the XOR gate coupled to the third terminal of the overcurrent detection circuitry, the delay circuit having a first terminal and a second terminal, the first terminal of the delay circuit coupled to the third terminal of the XOR gate, the AND gate having a first terminal, a second terminal, and a third terminal, the first terminal of the AND gate coupled to the second terminal of the delay circuit, the second terminal of the AND gate coupled to the third terminal of the overcurrent detection circuitry, and the third terminal of the AND gate coupled to the fourth terminal of the overcurrent detection circuitry.

8. The circuit of claim 4, wherein the high-side switch control circuitry includes an AND gate, a first inverter, and a second inverter, the AND gate having a first terminal, a second terminal, and a third terminal, the first inverter having a first terminal and a second terminal, the second inverter having a first terminal and a second terminal, the first terminal of the AND gate coupled to the first terminal of the high-side switch control circuitry, the second terminal of the AND gate coupled to the second terminal of the high-side switch control circuitry, the third terminal of the AND gate coupled to the first terminal of the first inverter, the second terminal of the first inverter coupled to the fourth terminal of the high-side switch control circuitry, the first terminal of the second inverter coupled to the second terminal of the high-side switch control circuitry, and the second terminal of the second inverter coupled to the third terminal of the high-side switch control circuitry.

9. The circuit of claim 4, wherein the low-side switch control circuitry includes an OR gate, a first inverter, and a second inverter, the OR gate having a first terminal, a second terminal, and a third terminal, the first inverter having a first terminal and a second terminal, the second inverter having a first terminal and a second terminal, the first terminal of the OR gate coupled to the first terminal of the low-side switch control circuitry, the second terminal of the OR gate coupled to the second terminal of the low-side switch control circuitry, the third terminal of the OR gate coupled to the first terminal of the first inverter, the second terminal of the first inverter coupled to the fourth terminal of the low-side switch control circuitry, the first terminal of the second inverter coupled to the second terminal of the low-side switch control circuitry, and the second terminal of the second inverter coupled to the third terminal of the low-side switch control circuitry.

10. The circuit of claim 1, wherein the overcurrent detection circuitry is configured to:

receive an output voltage on the third terminal of the overcurrent detection circuitry;

compare the output voltage to a reference voltage to obtain comparison results; and provide a control signal at the second terminal of the overcurrent detection circuitry to the switch control circuitry responsive to the comparison results.

11. A circuit comprising:

a driver circuit having a first terminal, a second terminal, and a third terminal, the driver circuit including:

an output switch having a first terminal, a second terminal, and a control terminal;

overcurrent detection circuitry having a first terminal, a second terminal, a third terminal, and a fourth terminal, the overcurrent detection circuitry configured to:

receive a pulse-width modulation (PWM) control signal on the third terminal of the overcurrent detection circuitry, and provide an overcurrent detection signal at the fourth terminal of the overcurrent detection circuitry responsive to the PWM control signal;

switch control circuitry having a first terminal, a second terminal, and a third terminal, the first terminal of the switch control circuitry coupled to the second terminal of the overcurrent detection circuitry, the second terminal of the switch control circuitry coupled to the third terminal of the overcurrent detection circuitry, and the third terminal of the switch control circuitry coupled to the control terminal of the output switch, the switch control circuitry configured to:

receive the PWM control signal on the second terminal of the switch control circuitry; and provide a control signal to the control terminal of the output switch responsive to the PWM control signal and the overcurrent detection signal.

12. The circuit of claim 11, wherein the switch control circuitry is configured to:

provide a first gate drive control signal to the output switch responsive to the PWM control signal; and after a delay interval, provide a second gate drive control signal to the output switch responsive to the PWM control signal and the overcurrent detection signal indicating there is not an overcurrent condition.

13. The circuit of claim 11, wherein the driver circuit is configured to:

turn on an auxiliary output switch responsive to the PWM control signal, the auxiliary output switch coupled in parallel with the output switch; and after a delay interval, turn on the output switch responsive to the PWM control signal and the overcurrent detection signal indicating there is not an overcurrent condition.

14. The circuit of claim 13, wherein the driver circuit is a first driver circuit, the driver circuit receives a first supply voltage on the first terminal of the driver circuit, the PWM control signal is a first PWM control signal, the output switch is a first output switch, the circuit includes a second driver circuit, the second driver circuit having a first terminal, a second terminal, and a third terminal, the second driver circuit having a second output switch, and the second driver circuit is configured to:

receive a second supply voltage at the first terminal of the second driver circuit;

receive a second PWM control signal at the second terminal of the second driver circuit; and control the second output switch to provide an output voltage at the third terminal of the second driver circuit responsive to the second supply voltage, the second PWM control signal, and overcurrent detection results.

15. The circuit of claim 11, wherein the driver circuit includes half-bridge output switches including the output switch, and the driver circuit is configured to control the half-bridge output switches to provide an output voltage at the third terminal of the driver circuit responsive to a supply voltage received on the first terminal of the driver circuit, the PWM control signal, and the overcurrent detection signal.

16. The circuit of claim 11, wherein the driver circuit includes full H-bridge output switches including the output switch, and the driver circuit is configured to control the full H-bridge output switches to provide an output voltage at the third terminal of the driver circuit responsive to a supply voltage received on the first terminal of the driver circuit, the PWM control signal, and the overcurrent detection results.

17. The circuit of claim 11, wherein the driver circuit includes multi-bridge output switches including the output switch, and the driver circuit is configured to control the multi-bridge output switches to provide an output voltage at the third terminal of the driver circuit responsive to a supply voltage received on the first terminal of the driver circuit, the PWM control signal, and the overcurrent detection results.

18. A method, comprising:

receiving a control signal;

responsive to the control signal, closing a first switch to directly couple a first reference voltage to a control terminal of an output switch of a driver circuit to partially turn on the output switch;

sensing a voltage at an output terminal of the output switch while the output switch is in the partially turned on state;

comparing the sensed voltage to a reference voltage to generate an overcurrent detection result that indicates whether an overcurrent condition is present; and after a delay interval, closing a second switch to directly couple a second reference voltage to the control terminal of the output switch to fully turn on the output switch responsive to the overcurrent detection results indicating there is no overcurrent condition present, wherein the second reference voltage is greater than the first reference voltage.

19. The method of claim 18, further comprising:

responsive to the control signal, closing a third switch to directly couple a third reference voltage to a control terminal of a second output switch of the driver circuit to partially turn on the second output switch, wherein the second output switch has an output terminal coupled to the output terminal of the output switch; and after the delay interval, closing a fourth switch to directly couple a fourth reference voltage to the control terminal of the second output switch to fully turn on the second output switch responsive to the overcurrent detection result indicating there is no overcurrent condition present.

20. The method of claim 19, wherein the fourth reference voltage is greater than the third reference voltage.

* * * * *